(12) United States Patent
Ooga et al.

(10) Patent No.: US 8,669,306 B2
(45) Date of Patent: Mar. 11, 2014

(54) CURABLE COMPOSITION

(75) Inventors: Kazuhiko Ooga, Minato-ku (JP);
Kazuya Kimura, Minato-ku (JP);
Atsushi Umino, Minato-ku (JP);
Ritsuko Azuma, Minato-ku (JP)

(73) Assignee: Showa Denko K.K., Tokyo (JP)

( * ) Notice: Subject to any disclaimer, the term of this patent is extended or adjusted under 35 U.S.C. 154(b) by 222 days.

(21) Appl. No.: 13/142,234

(22) PCT Filed: Dec. 18, 2009

(86) PCT No.: PCT/JP2009/071114
§ 371 (c)(1),
(2), (4) Date: Jun. 24, 2011

(87) PCT Pub. No.: WO2010/073981
PCT Pub. Date: Jul. 1, 2010

(65) Prior Publication Data
US 2011/0253426 A1 Oct. 20, 2011

(30) Foreign Application Priority Data
Dec. 26, 2008 (JP) .................................. 2008-333430

(51) Int. Cl.
*C08K 5/15* (2006.01)

(52) U.S. Cl.
USPC ............ 524/111; 524/336; 524/378; 524/492

(58) Field of Classification Search
USPC .................................. 524/336, 492, 111, 378
See application file for complete search history.

(56) References Cited

U.S. PATENT DOCUMENTS

| 2007/0293636 A1 | 12/2007 | Kimura et al. |
| 2009/0099283 A1 | 4/2009 | Ishihara et al. |
| 2009/0118422 A1 | 5/2009 | Uchida et al. |
| 2009/0133905 A1 | 5/2009 | Kimura et al. |

FOREIGN PATENT DOCUMENTS

| EP | 1 997 843 A1 | | 12/2008 |
| JP | 2003-041210 A | | 2/2003 |
| JP | 2003-113338 A | | 5/2003 |
| JP | 2003-198105 | * | 7/2003 |
| JP | 2003-198105 | | 7/2003 |
| JP | 2005-023183 A | | 1/2005 |
| JP | 2006-117922 A | | 5/2006 |
| JP | 2007-39673 A | | 2/2007 |
| JP | 2007-099891 A | | 4/2007 |
| JP | 2007-100038 A | | 4/2007 |
| JP | 2008-201847 A | | 9/2008 |
| JP | 2008-214413 A | | 9/2008 |

OTHER PUBLICATIONS

Supplementary European Search Report for Application No. 09834782.6-2210/2383310 dated Nov. 6, 2012.

* cited by examiner

*Primary Examiner* — Edward Cain
(74) *Attorney, Agent, or Firm* — Sughrue Mion, PLLC

(57) ABSTRACT

It is an object of the present invention to provide a curable composition which provides a cured product excellent in low warpage properties and long-term electrical insulation reliability and causes little bleeding during screen printing. The present invention is a curable composition comprising the following components (a) to (e): a component (a): polyurethane having a functional group capable of curing reaction and a carbonate bond, a component (b): γ-butyrolactone, a component (c): diethylene glycol diethyl ether, a component (d): inorganic fine particles and/or organic fine particles, and a component (e): a compound having two or more epoxy groups in one molecule.

11 Claims, No Drawings

CURABLE COMPOSITION

CROSS REFERENCE TO RELATED APPLICATIONS

This application is a National Stage of International Application No. PCT/JP2009/071114 filed Dec. 18, 2009, the contents of which are incorporated herein by reference in their entirety.

TECHNICAL FIELD

The present invention relates to a curable composition which causes little bleeding during screen printing, a cured product obtained by curing the composition and uses of the cured product. More particularly, the present invention relates to the following matters (1) to (3) and the like:

(1) a curable composition which provides a cured product excellent in low warpage properties and long-term electrical insulation reliability, causes little bleeding during screen printing and uses polyurethane having a functional group capable of curing reaction and a carbonate bond, (2) a cured product obtained by curing the above composition, and a flexible wiring board partially or wholly covered with the cured product, and (3) a process for producing a flexible wiring board covered with a protective film comprising the cured product.

BACKGROUND ART

In a resist ink to form a protective film or the like on a conventional wiring board, an inorganic filler has been used as a means of improving screen printability (prevention of bleeding during screen printing) in order to meet the tendency of the fining of pitch, as disclosed in Japanese Patent Laid-Open Publication No. 2003-113338 (patent document 1) and Japanese Patent Laid-Open Publication No. 2008-214413 (patent document 2). However, there is a problem that impurities and reaggregation products derived from the inorganic filler become defects to thereby lower electric insulation properties of a resist. By the way, as a method to form a resist on a wiring board, screen printing has been generally adopted.

As a means to achieve a good balance between improvement of screen printability for meeting the fining of pitch and that of electrical insulation reliability, there was a technique to incorporate a special filler into a resist ink, as disclosed in Japanese Patent Laid-Open Publication No. 2007-100038 (patent document 3).

However, it is predicted that with development of a semi-additive process, the line space of wiring of a flexible wiring board is further narrowed (e.g., not more than 20 μm pitch).

With this further fining of pitch, further development of a resist ink (curable composition) excellent in prevention of bleeding during screen printing is desired.

On the other hand, concerning polyurethane having a functional group necessary for curing reaction and a carbonate bond, which is used for a resist, Japanese Patent Laid-Open Publication No. 2003-198105 (patent document 4) discloses a curable composition containing polyurethane having an acid anhydride group and/or an isocyanate group, and a carbonate bond. Moreover, as a curable composition containing polyurethane having a carboxyl group and a carbonate bond, Japanese Patent Laid-Open Publication No. 2006-117922 (patent document 5), Japanese Patent Laid-Open Publication No. 2007-39673 (patent document 6) and Japanese Patent Laid-Open Publication No. 2008-201847 (patent document 7) disclose a curable composition. In any of those documents, however, prevention of bleeding during screen printing is not described at all.

CITATION LIST

Patent Document

Patent document 1: Japanese Patent Laid-Open Publication No. 2003-113338
Patent document 2: Japanese Patent Laid-Open Publication No. 2008-214413
Patent document 3: Japanese Patent Laid-Open Publication No. 2007-100038
Patent document 4: Japanese Patent Laid-Open Publication No. 2003-198105
Patent document 5: Japanese Patent Laid-Open Publication No. 2006-117922
Patent document 6: Japanese Patent Laid-Open Publication No. 2007-39673
Patent document 7: Japanese Patent Laid-Open Publication No. 2008-201847

SUMMARY OF INVENTION

Technical Problem

It is an object of the present invention to provide a curable composition which causes little bleeding during screen printing.

More particularly, it is an object of the present invention to provide a curable composition which provides a cured product excellent in low warpage properties and long-term electrical insulation reliability and causes little bleeding during screen printing.

Solution to Problem

In order to solve the above problem, the present inventors have earnestly studied, and as a result, they have found that when printing of a curable composition containing polyurethane having a specific structure is carried out on a flexible wiring board by a screen printing method, bleeding of a printed substance (curable composition) is little, warpage of the flexible wiring board when the curable composition is cured is small, and a cured product obtained by curing the curable composition is excellent in flexibility and long-term electrical insulation properties. Thus, the present invention has been accomplished.

That is to say, the present invention relates to the following matters.

[1] A polyurethane solution comprising the following components (a) to (c):
a component (a): polyurethane having a functional group capable of curing reaction and a carbonate bond,
a component (b): γ-butyrolactone, and
a component (c): diethylene glycol diethyl ether.

[2] A curable composition comprising the following components (a) to (e):
a component (a): polyurethane having a functional group capable of curing reaction and a carbonate bond,
a component (b): γ-butyrolactone,
a component (c): diethylene glycol diethyl ether,
a component (d): inorganic fine particles and/or organic fine particles, and
a component (e): a compound having two or more epoxy groups in one molecule.

[3] The curable composition as described in [2], wherein the component (a) is polyurethane having at least one functional group selected from the group consisting of a carboxyl group, an isocyanate group and a cyclic acid anhydride group, and a carbonate bond.

[4] The curable composition as described in [2] or [3], wherein the ratio between the component (b) and the component (c) contained in the curable composition is in the range of 90:10 to 20:80 (component (b):component (c)), in terms of mass ratio.

[5] The curable composition as described in any one of [2] to [4], wherein the component (d) consists of silica fine particles.

[6] The curable composition as described in any one of [2] to [5], which further comprises a curing accelerator.

[7] The curable composition as described in any one of [2] to [6], which further comprises a defoaming agent.

[8] The curable composition as described in any one of [2] to [7], wherein the component (e) is a compound having two or more epoxy groups in one molecule and having an aromatic ring structure and/or an alicyclic structure.

[9] The curable composition as described in [8], wherein the component (e) is a compound having two or more epoxy groups in one molecule and having a tricyclodecane structure and an aromatic ring structure.

[10] The curable composition as described in any one of [2] to [9], which has a thixotropy index of not less than 1.1.

[11] A cured product obtained by curing the curable composition as described in any one of [2] to [10].

[12] A flexible wiring board covered with a cured product, wherein a surface of a flexible wiring board in which wiring is formed on a flexible substrate is partially or wholly covered with the cured product as described in [11].

[13] A process for producing a flexible wiring board covered with a protective film, comprising:
printing the curable composition as described in any one of [2] to [10] on at least apart of a tin-plated wiring pattern portion of a flexible wiring board to form a printed film on the pattern, and
thermally curing the printed film at 80 to 130° C. to form a protective film.

Advantageous Effects of Invention

When printing of the curable composition of the present invention is carried out on a flexible wiring board by a screen printing method, bleeding of a printed substance can be inhibited, and warpage of the flexible wiring board on which the curable composition has been printed is small when the composition is cured. In addition, the cured product obtained by curing the curable composition is excellent in flexibility and long-term electrical insulation properties. Therefore, the curable composition of the present invention is useful as a resist ink for insulative protection of wiring, such as a solder resist ink, and the cured product of the present invention is useful as a protective film, such as a resist for insulative protection of wiring.

DESCRIPTION OF EMBODIMENTS

The present invention is described in detail hereinafter.
First, the polyurethane solution of the present invention (I) is described.
[Present Invention (I)]
The present invention (I) is a polyurethane solution comprising the following components (a) to (c):

a component (a): polyurethane having a functional group capable of curing reaction and a carbonate bond,
a component (b): γ-butyrolactone, and
a component (c): diethylene glycol diethyl ether.
Each of the components is described below.
<Component (a)>
The component (a) which is an essential component of the polyurethane solution of the present invention (I) is polyurethane having a functional group capable of curing reaction and a carbonate bond (also referred to as "polyurethane A" simply hereinafter).

The "functional group capable of curing reaction" in the component (a) is specifically a functional group which reacts with an epoxy group, and the functional group is not particularly restricted provided that it can react with the component (e) which is an essential component of the later-described curable composition of the present invention (II). Examples of the functional groups include a carboxyl group, an isocyanate group, a hydroxyl group and a cyclic acid anhydride group. Taking into account reactivity with a compound having an epoxy group, which is the component (e), a carboxyl group, an isocynate group and a cyclic acid anhydride group are preferred functional groups among them. Taking into account a balance between storage stability and reactivity of the component (a), a carboxyl group and a cyclic acid anhydride group are more preferred functional groups, and a carboxyl group is a particularly preferred functional group.

The polyurethane A having a functional group capable of curing reaction and a carbonate bond can be produced by, for example, the following process.

It can be synthesized in the presence or absence of a publicly known urethanization catalyst such as dibutyltin dilaurate, (poly)carbonate polyol, a polyisocyanate compound, by reacting carboxyl group-containing diol, and if necessary, polyol other than the (poly)carbonate polyol and the carboxyl group-containing diol, a monohydroxyl compound and a monoisocyanate compound, using a mixed solvent containing diethylene glycol diethyl ether and γ-butyrolactone. This reaction is preferably carried out in the absence of a catalyst, because property values given when a cured film of the polyurethane solution of the present invention (I) is practically used are finally improved.

The (poly)carbonate polyol which is a raw material of the polyurethane A is not specifically restricted provided that it is a compound having one or more carbonate bonds and two or more alcoholic hydroxyl groups in a molecule. For example, there can be mentioned (poly)carbonate diol having two hydroxyl groups in one molecule, and (poly)carbonate triol and (poly)carbonate tetraol having three or more hydroxyl groups in one molecule.

The (poly)carbonate polyol can be obtained by reacting, as a raw material, diol or a polyol mixture containing diol as a main component with a carbonic acid ester or phosgene. For example, when only diol is used as a raw material of (poly) carbonate polyol, which is supposed to be reacted with the carbonic acid ester or phosgene, (poly)carbonate diol is prepared. Its structure is represented by the following formula (1).

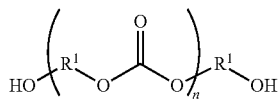

Formula (1)

In the formula (1), (n+1) $R^1$ are each independently a residue obtained by removing a hydroxyl group from the corresponding diol, n is a natural number, and n is usually an integer of 3 to 50.

The (poly)carbonate polyol represented by the formula (1) can be produced by using, as a raw material, 1,4-butanediol, 1,5-pentanediol, 1,6-hexanediol, 3-methyl-1,5-pentanediol, 1,8-octanediol, 1,3-cyclohexanedimethanol, 1,4-cyclohexanedimethanol, 1,9-nonanediol, 2-methyl-1,8-octanediol, 2-ethyl-4-butyl-1,3-propanediol, 2,4-diethyl-1,5-pentanediol, 1,10-decanediol, 1,2-tetradecanediol or the like.

The (poly)carbonate polyol may be (poly)carbonate polyol having plural kinds of alkylene groups in its structure (copolymerized (poly)carbonate polyol). From the viewpoint of prevention of crystallization of polyurethane A, use of the copolymerized (poly)carbonate polyol is advantageous in many cases. Taking into account solubility into reaction solvents (diethylene glycol diethyl ether, γ-butyrolactone, etc.) for synthesis of polyurethane A, it is preferable to use (poly)carbonate polyol having a branched structure and having a hydroxyl group at the end of the branched chain, in combination.

The (poly)carbonate polyols described above may be used singly or may be used in combination of two or more kinds thereof.

The polyisocyanate compound which is a raw material of the polyurethane A having a functional group capable of curing reaction and a carbonate bond is not particularly restricted provided that it has two or more isocyanate groups. Specific examples of the polyisocyanate compounds include 1,4-cyclohexane diisocyanate, isophorone diisocyanate, methylenebis(4-cyclohexyl isocyanate), 1,3-bis(isocyanatomethyl)cyclohexane, 1,4-bis(isocyanatomethyl)cyclohexane, 2,4-tolylene diisocyanate, 2,6-tolylene diisocyanate, diphenylmethane-4,4'-diisocyanate, 1,3-xylylene diisocyanate, 1,4-xylylene diisocyanate, a biuret form of isophorone diisocyanate, a biuret form of hexamethylene diisocyanate, an isocyanurate form of isophorone diisocyanate, an isocyanurate form of hexamethylene diisocyanate, lysine triisocyanate, lysine diisocyanate, hexamethylene diisocyanate, 2,4,4-trimethylhexamethylene diisocyanate, 2,2,4-trimethylhexamethylene diisocyanate and norbornane diisocyanate.

In order to maintain electrical insulation performance of the later-described cured product of the present invention (III) high, 1,4-cyclohexane diisocyanate, isophorone diisocyanate, methylenebis(4-cyclohexyl isocyanate), 1,3-bis(isocyanatomethyl)cyclohexane, 1,4-bis(isocyanatomethyl)cyclohexane, diphenylmethane-4,4'-diisocyanate, 1,3-xylylene diisocyanate, 1,4-xylylene diisocyanate, 2,4,4-trimethylhexamethylene diisocyanate, 2,2,4-trimethylhexamethylene diisocyanate and norbornane diisocyanate are preferable, and methylenebis(4-cyclohexyl isocyanate), diphenylmethane-4,4'-diisocyanate and norbornane diisocyanate are more preferable.

The polyisocyanate compounds described above may be used singly or may be used in combination of two or more kinds thereof.

The carboxyl group-containing diol which is a raw material of the polyurethane A is not particularly restricted provided that it is a compound having one or more carboxyl groups and two alcoholic hydroxyl groups in a molecule. Specific examples of the carboxyl group-containing diols include dimethylolpropionic acid, 2,2-dimethylolbutanoic acid, N,N-bis(hydroxyethyl)glycine and N,N-bis(hydroxyethyl)glycine. Of these, dimethylolpropionic acid and 2,2-dimethylolbutanoic acid are particularly preferable from the viewpoint of solubility into reaction solvents for synthesis of polyurethane A. These carboxyl group-containing diols may be used singly or may be used in combination of two or more kinds thereof.

The polyol other than the (poly)carbonatepolyol and the carboxyl group-containing diol, which is used as a raw material of the polyurethane A when needed, is not particularly restricted provided that it is a polyol neither (poly)carbonate polyol nor carboxyl group-containing diol. Examples thereof include diols such as 1,4-butanediol, 1,5-pentanediol, 1,6-hexanediol, 3-methyl-1,5-pentanediol, 1,8-octanediol, 1,3-cyclohexanedimethanol, 1,4-cyclohexanedimethanol, 1,9-nonanediol, 2-methyl-1,8-octanediol, 2-ethyl-4-butyl-1,3-propanediol, 2,4-diethyl-1,5-pentanediol, 1,10-decanediol or 1,2-tetradecanediol; and compounds having three or more alcoholic hydroxyl groups in one molecule, such as trimethylolpropane, trimethylolethane, glycerol and pentaerythritol.

In general, raw material polyols remaining in the production of (poly)carbonate polyol can be used for the production of the polyurethane A as they are or can be used therefor together with additional polyol components. These polyols may be used singly or may be used in combination of two or more kinds thereof.

The monohydroxyl compound which is used as a raw material of the polyurethane A when needed is not particularly restricted provided that it is a compound having one alcoholic hydroxyl group in a molecule but having no other substituent that is richer than the alcoholic hydroxyl group in reactivity with the isocyanate group. Specific examples of the monohydroxyl compounds include methanol, ethanol, n-propanol, isopropanol, n-butanol, isobutanol, sec-butanol, t-butanol, ethylene glycol monoethyl ether, diethylene glycol monoethyl ether, diethylene glycol monoisopropyl ether, diethylene glycol monoisobutyl ether and dipropylene glycol monopropyl ether.

These monohydroxyl compounds may be used singly or may be used in combination of two or more kinds thereof.

As the monoisocyanate compound which is used as a raw material of the polyurethane A when needed, cyclohexyl isocyanate, octadecyl isocyanate, phenyl isocyanate, toluoyl isocyanate or the like can be used. Taking into account resistance to discoloration during heating of the later-described curable composition of the present invention (II), cyclohexyl isocyanate and octadecyl isocyanate are preferable.

As previously described, the polyurethane A can be synthesized by reacting the (poly)carbonate polyol, the polyisocyanate compound, the carboxyl group-containing diol, and if necessary, the polyol other than the (poly)carbonate polyol and the carboxyl group-containing diol, the monohydroxyl compound and the monoisocyanate compound using a mixed solvent containing diethylene glycol diethyl ether and γ-butyrolactone in the presence or absence of a publicly known urethanization catalyst. There is no specific limitation on the order of feeding these raw materials to the reactor, but in usual, the (poly)carbonate polyol, the carboxyl group-containing diol, and if necessary, the polyol other than the (poly)carbonate polyol and the carboxyl group-containing diol are first fed to the reactor to dissolve them in the solvent. Thereafter, the polyisocyanate compound is dropwise added usually at 20 to 140° C., more preferably 60 to 120° C., and then the components are reacted with one another at 50 to 160° C., more preferably 60 to 150° C.

The molar ratio of the raw materials fed is controlled according to the desired molecular weight and acid value of the polyurethane A. By the use of the monohydroxyl compound, the molecular weight of the polyurethane A can also be adjusted to a desired one. That is to say, when a desired number-average molecular weight is reached (or a desired number-average molecular weight is approached), the monohydroxyl compound is added for the purpose of capping the isocyanate group at the end and inhibiting further increase of the number-average molecular weight.

In the case where the monohydroxyl compound is used, there is no problem if the number of isocyanate groups of the polyisocyanate compound is made smaller or larger than or equal to the total number of hydroxyl groups of the (poly) carbonate polyol, carboxyl group-containing diol and the polyol other than the (poly)carbonate polyol and the carboxyl group-containing diol.

When the monohydroxyl compound is used in excess, an unreacted monohdyroxyl compound remains. In this case, the excess monohydroxyl compound may be used as a part of a solvent as it is, or may be removed by distillation or the like.

The purpose of introduction of the monohydroxyl compound into the polyurethane A is to inhibit increase of the molecular weight of the polyurethane A (that is, to terminate reaction). In order to incorporate the monohydroxyl compound into the polyurethane, the monohydroxyl compound is dropwise added to the solution at 20 to 150° C., more preferably 70 to 140° C., and the solution is maintained at the same temperature to complete the reaction.

In the introduction of the monoisocyanate compound into the polyurethane A, it is necessary to use the monoisocyanate compound so that the number of its isocyanate groups should become smaller than the total number of hydroxyl groups of the (poly)carbonate polyol, the carboxyl group-containing diol and the polyol other than the (poly)carbonate polyol and the carboxyl group-containing diol, in order that the end of the polyurethane molecule may become a hydroxyl group. At the time the reaction of all the hydroxyl groups of the (poly) carbonate polyol, carboxyl group-containing diol and the polyol other than the (poly)carbonate polyol and the carboxyl group-containing diol with the isocyanate groups of the polyisocyanate compound is almost completed, the monoisocyante compound is dropwise added to the solution of polyurethane at 20 to 150° C., more preferably 70 to 140° C., in order to react the hydroxyl groups remaining at the ends of the polyurethane with the monoisocyanate compound. Thereafter, the solution is maintained at the same temperature to complete the reaction.

The number-average molecular weight of the polyurethane A obtained as, for example, aforedescribed is preferably in the range of 1,000 to 100,000, more preferably 3,000 to 50,000, particularly preferably 5,000 to 30,000.

The "number-average molecular weight" referred to herein is a number-average molecular weight in terms of polystyrene as measured by gel permeation chromatography (abbreviated to "GPC" hereinafter). If the number-average molecular weight is less than 1,000, elongation, flexibility and strength of the cured film are sometimes impaired, while if the number-average molecular weight exceeds 100,000, solubility of the polyurethane in solvents (components (b) and (c)) is lowered, and besides, even if the polyurethane is dissolved, the viscosity is increased, resulting in restriction in the use of the polyurethane solution of the present invention (I).

In the present specification, the measuring conditions of GPC are as follows, unless otherwise noted.

Apparatus name: HPLC Unit HSS-2000 manufactured by JASCO Corporation
Column: Shodex Column LF-804
Mobile phase: tetrahydrofuran
Flow rate: 1.0 mL/min
Detector: RI-2031Plus manufactured by JASCO Corporation
Temperature: 40.0° C.
Sample quantity: Sample loop 100µ liter
Sample concentration: adjusted to about 0.1% by mass.

The acid value of the polyurethane A is preferably in the range of 5 to 120 mgKOH/g, more preferably 10 to 50 mgKOH/g. If the acid value is less than 5 mgKOH/g, reactivity of the later-described curing agent (component (e)) etc. with other components contained in the later-described curable composition of the present invention (II) is lowered, and the heat resistance of a cured product of the curable composition is sometimes lowered. On the other hand, if the acid value exceeds 120 mgKOH/g, the cured film is sometimes too rigid and brittle.

The polyurethane A is preferably polyurethane having a number-average molecular weight of 1,000 to 100,000 and an acid value of 5 to 120 mgKOH/g and having a functional group capable of curing reaction and a carbonate bond, and is more preferably polyurethane having a number-average molecular weight of 3,000 to 50,000 and an acid value of 10 to 50 mgKOH/g and having a functional group capable of curing reaction and a carbonate bond.

In the present specification, the acid value of the polyurethane A is an acid value as measured by a potentiometric titration method in accordance with JIS K0070.

As the functional group capable of curing reaction, there can be mentioned a cyclic acid anhydride group, as previously described, and the polyurethane having a cyclic acid anhydride group and a carbonate bond is, for example, polyurethane having an imide bond and having a cyclic acid anhydride group and a carbonate bond, which is described in [0023] to [0067] and Example 1 of Japanese Patent Laid-Open Publication No. 2003-198105.

<Component (b) and Component (c)>

The component (b) which is an essential component of the polyurethane solution of the present invention (I) is γ-butyrolactone, and the component (c) which is an essential component of the polyurethane solution of the present invention (I) is diethylene glycol diethyl ether. The components (b) and (c) are solvents in the polyurethane solution of the present invention.

By the use of a mixture of γ-butyrolactone and diethylene glycol diethyl ether, bleeding of an ink is remarkably inhibited when printing is carried out by a screen printing method using the polyurethane solution of the present invention (I) as a resist ink for insulative protection of wiring. Moreover, the component (a) has good solubility in γ-butyrolactone and diethylene glycol diethyl ether. In addition, the γ-butyrolactone and the diethylene glycol diethyl ether both have a flash point of not lower than 70° C. and are preferable also from the viewpoint of safety.

In order to allow the above effects to sufficiently exhibit, the ratio between the component (b) and the component (c) used is preferably in the range of 90:10 to 20:80 (component (b):component (c)), more preferably 90:10 to 40:60 (component (b):component (c)), in terms of mass ratio.

A solvent other than the components (b) and (c) can be used in combination, within limits not detrimental to the solubility of the component (a).

Examples of such solvents include diethylene glycol monoethyl ether acetate, diethylene glycol butyl methyl ether, tripropylene glycol dimethyl ether, triethylene glycol dimethyl ether, diethylene glycol monobutyl ether, butyl phenyl ether, amyl phenyl ether, diethylene glycol monoisopropyl ether, diethylene glycol monoisobutyl ether and dipropylene glycol monopropyl ether. These solvents may be used singly or may be used in combination of two or more kinds thereof.

The total amount of the component (b) and the component (c) in the polyurethane solution of the present invention (I) is preferably not less than 70% by mass, more preferably not less than 80% by mass, based on the total amount of the solvents used.

The total amount of the component (b) and the component (c) in the polyurethane solution of the present invention (I) is preferably in the range of 55 to 210 parts by mass, more preferably 75 to 185 parts by mass, based on 100 parts by mass of the component (a).

[Present Invention (II)]

Next, the curable composition of the present invention (II) is described.

The present invention (II) is a curable composition comprising the following components (a) to (e):

a component (a): polyurethane having a functional group capable of curing reaction and a carbonate bond, a component (b): γ-butyrolactone, a component (c): diethylene glycol diethyl ether, a component (d): inorganic fine particles and/or organic fine particles, and a component (e): a compound having two or more epoxy groups in one molecule.

Each of the components are described below.

<Component (a)>

The component (a) which is an essential component of the curable composition of the present invention (II) is the same as the component (a) which is the essential component of the polyurethane solution of the present invention (I).

<Component (b) and Component (c)>

The component (b) and the component (c) which are essential components of the curable composition of the present invention (II) are the same as the component (b) and the component (c), respectively, which are the essential components of the polyurethane solution of the present invention (I). These function as solvents for solids in the curable composition of the present invention (II).

By the use of the components (b) and (c) in combination, bleeding of an ink is remarkably inhibited when printing is carried out by a screen printing method using the curable composition of the present invention (II) as a resist ink for insulative protection of wiring, such as a solder resist ink. Moreover, the solubility of the component (a) into the components (b) and (c) is good. In addition, the components (b) and (c) both have a flash point of not lower than 70° C. and are preferable also from the viewpoint of safety.

In order to allow the above effects to sufficiently exhibit, the ratio between the component (b) and the component (c) used is preferably in the range of 90:10 to 20:80 (component (b):component (c)), more preferably 90:10 to 40:60 (component (b):component (c)), in terms of mass ratio.

If necessary, a solvent other than the component (b) and the component (c) can be used in combination.

The purpose why the solvent other than the component (b) and the component (c) is used in the curable composition of the present invention (II) is frequently that change of viscosity of the curable composition due to evaporation of the solvents (that is, component (b) and component (c)) contained in the curable composition of the present invention (II) is inhibited in the screen printing method in general. When the solvent other than the component (b) and the component (c) is used for that purpose, the boiling point of the solvent is preferably in the range of 205 to 230° C.

Examples of the solvents having a boiling point of 205 to 230° C., which are used for the above purpose, include diethylene glycol monoethyl ether acetate, diethylene glycol butyl methyl ether, tripropylene glycol dimethyl ether, triethylene glycol dimethyl ether, diethylene glycol monobutyl ether, butyl phenyl ether, amyl phenyl ether, diethylene glycol monoisopropyl ether, diethylene glycol monoisobutyl ether and dipropylene glycol monopropyl ether. These may be used singly or may be used in combination of two or more kinds thereof.

The "boiling point" described in the present specification means a boiling point at normal pressure (that is, 101325 Pa), unless otherwise noted.

The total amount of the component (b) and the component (c) in the curable composition of the present invention (II) is preferably not less than 60% by mass, more preferably not less than 70% by mass, based on the total amount of the solvents used.

The total amount of the solvents containing the component (b) and the component (c) in the curable composition of the present invention (II) is preferably in the range of 50 to 200 parts by mass, more preferably 70 to 180 parts by mass, based on 100 parts by mass of the total amount of the component (a) and the component (e).

<Component (d)>

The component (d) which is an essential component of the curable composition of the present invention (II) consists of inorganic fine particles and/or organic fine particles.

In the present specification, the "inorganic fine particles and/or organic fine particles" are defined as those including not only inorganic fine particles and organic fine particles but also organic-inorganic composite type fine particles obtained by physically coating a particulate inorganic compound with an organic compound or chemically surface-treating it with an organic compound.

The inorganic fine particles for use in the curable composition of the present invention (II) are not particularly restricted provided that they are dispersed in the curable composition of the present invention (II) to form a paste.

Examples of such inorganic fine particles include silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO.TiO_2$), barium carbonate ($BaCO_3$), lead titanate ($PbO.TiO_2$), lead zirconate titanate (PZT), lead lanthanum zirconate titanate (PLZT), gallium oxide ($Ga_2O_3$), spinel ($MgO.Al_2O_3$), mullite ($3Al_2O_3.2SiO_2$), cordierite ($2MgO.2Al_2O_3.5SiO_2$), talc ($3MgO.4SiO_2.H_2O$), aluminum titanate ($TiO_2$—$Al_2O_3$), yttria-containing zirconia ($Y_2O_3$—$ZrO_2$), barium silicate ($BaO.8SiO_2$), boron nitride (BN), calcium carbonate ($CaCO_3$), calcium sulfate ($CaSO_4$), zinc oxide (ZnO), magnesium titanate ($MgO.TiO_2$), barium sulfate ($BaSO_4$), organic bentonite, and carbon (C). These may be used singly or may be used in combination of two or more kinds.

The organic fine particles for use in the curable composition of the present invention (II) are not particularly restricted provided that they are dispersed in the curable composition of the present invention (II) to form a paste.

As such organic fine particles, fine particles of a heat-resistant resin having an amide bond, an imide bond, an ester linkage or an ether linkage are preferable. As such resins, a polyimide resin or its precursor, a polyamidoimide resin or its precursor, and a polyamide resin are preferably mentioned from the viewpoints of heat resistance and mechanical properties.

The mean particle diameter of the component (d) (inorganic fine particles and/or organic fine particles) is preferably in the range of 0.01 to 10 μm, more preferably 0.1 to 5 μm.

The amount of the component (d) blended in the curable composition of the present invention (II) is usually in the range of 1 to 150 parts by mass, preferably 1 to 120 parts by mass, more preferably 1 to 60 parts by mass, based on 100 parts by mass of the total amount of the components (a) to (c) and the component (e) contained in the curable composition.

<Component (e)>

The component (e) which is an essential component of the curable composition of the present invention (II) is not particularly restricted provided that it is a compound having two or more epoxy groups in one molecule. The number of epoxy groups in the component (e) is usually 4 or less. The component (e) functions as a curing agent in the curable composition of the present invention (II).

Examples of the compounds having two or more epoxy groups in one molecule include:

novolak type epoxy resins obtained by epoxidizing novalak resins that are obtained by condensing or cocondensing phenol, cresol, xylenol, resorcinol, catechol, phenols and/or naphthols (such as α-naphthol, β-naphthol or dihydroxynaphthalene) with compounds having an aldehyde group, such as formaldehyde, acetaldehyde, propionaldehyde, benzaldehyde or salycylaldehyde, in the presence of an acidic catalyst, e.g., phenolic novolak type epoxy resin and orthocresol novolak type epoxy resin;

diglycidyl ethers of bisphenol A, bisphenol F, bisphenol S, alkyl substituted or unsubstituted biphenol, stilbene-based phenols or the like (bisphenol A type epoxy compound, bisphenol F type epoxy compound, bisphenol S type epoxy compound, biphenyl type epoxy compound, stilbene type epoxy compound);

glycidyl ethers of alcohols such as butanediol, polyethylene glycol and polypropylene glycol;

glycidyl ester type epoxy resins of carboxylic acids such as phthalic acid, isophthalic acid and tetrahydrophthalic acid;

glycidyl type or methylglycidyl type epoxy resins, such as compounds wherein an active hydrogen bonded to a nitrogen atom of aniline, bis(4-aminophenyl)methane, isocyanuric acid or the like is replaced with glycidyl group;

glycidyl type or methylglycidyl type epoxy resins, such as compounds wherein an active hydrogen bonded to a nitrogen atom and an active hydrogen of a phenolic hydroxyl group of aminophenols such as p-aminophenol are replaced with glycidyl groups;

alicyclic epoxy resins, such as vinylcyclohexene diepoxide, 3,4-epoxycyclohexylmethyl-3,4-epoxycyclohexane carboxylate, and 2-(3,4-epoxy)cyclohexyl-5,5-spiro(3,4-epoxy)cyclohexane-m-dioxane obtained by epoxydizing olefin bond in a molecule;

glycidyl ethers of para-xylylene and/or meta-xylylene modified phenolic resins;

glycidyl ethers of terpene modified phenolic resins;

glycidyl ethers of dicyclopentadiene modified phenolic resins;

glycidyl ethers of cyclopentadiene modified phenolic resins;

glycidyl ethers of polycyclic aromatic ring modified phenolic resins;

glycidyl ethers of naphthalene ring-containing phenolic resins;

halogenated phenol novolak type epoxy resins;

hydroquinone type epoxy resins;

trimethylolpropane type epoxy resins;

linear aliphatic epoxy resins obtained by oxidizing an olefin bond with a peracid such as peracetic acid;

diphenylmethane type epoxy resins;

epoxidation products of aralkyl type phenolic resins such as phenol aralkyl resin and naphthol aralkyl resin;

sulfur atom-containing epoxy resins;

diglycidyl ether of tricyclo[5,2,1,0$^{2,6}$]decane dimethanol; and epoxy resins having adamantane structure, such as 1,3-bis(1-adamantyl)-4,6-bis(glycidyloyl)benzene, 1-[2',4'-bis(glycidyloyl)phenyl]adamantane, 1,3-bis(4'-glycidyloylphenyl)adamantane and 1,3-bis[2',4'-bis(glycidyloyl)phenyl]adamantane.

Of these, preferable are compounds having two or more epoxy groups in one molecule and having an aromatic ring structure and/or an alicyclic structure.

When the long-term electrical insulation performance of the later-described cured product of the present invention (III) is given a high priority, compounds having a tricyclodecane structure and an aromatic ring structure and having two or more epoxy groups, e.g., glycidyl ethers of dicyclopentadiene modified phenolic resins (that is, compounds having tricyclo[5,2,1,0$^{2,6}$]decane structure and aromatic ring structure and having two or more epoxy groups), and epoxy resins having an adamantane structure (that is, compounds having tricyclo[3,3,1,1$^{3,7}$]decane structure and aromatic ring structure and having two or more epoxy groups), such as 1,3-bis(1-adamantyl)-4,6-bis(glycidyloyl)benzene, 1-[2',4'-bis(glycidyloyl)phenyl]adamantane, 1,3-bis(4'-glycidyloylphenyl)adamantane and 1,3-bis[2',4'-bis(glycidyloyl)phenyl]adamantane, are preferable among the compounds having two or more epoxy groups in one molecule and having an aromatic ring structure and/or an alicyclic structure, because cured products having low water absorption can be provided. And compounds of the following formula (2) are particularly preferable.

Formula (2)

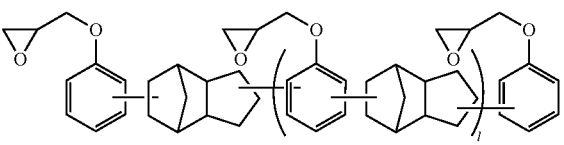

In the above formula, 1 is a natural number.

On the other hand, when reactivity with the component (a) which is the essential component of the curable composition of the present invention (II) is given a high priority, compounds having an amino group and an aromatic ring structure and having two or more epoxy groups, e.g., glycidyl type or methylglycidyl type epoxy resins, such as compounds wherein an active hydrogen bonded to a nitrogen atom of aniline or bis(4-aminophenyl)methane is replaced with glycidyl group, and glycidyl type or methylglycidyl type epoxy resins, such as compounds wherein an active hydrogen bonded to a nitrogen atom and an active hydrogen of phenolic hydroxyl group of aminophenols (e.g., p-aminophenol) are replaced with glycidyl groups, are preferable among the compounds having two or more epoxy groups in one molecule and having an aromatic ring structure and/or an alicyclic structure. And compounds of the following formula (3) are particularly preferable.

Formula (3)

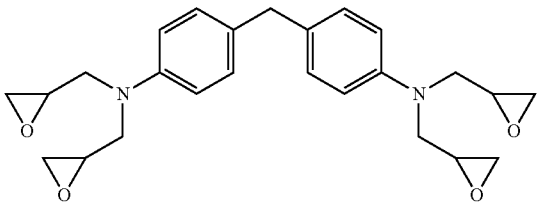

The component (e) may be used singly or may be used in combination of two or more kinds thereof.

The blending amount of the component (e) based on 100 parts by mass of the component (a) which is the essential component of the curable composition of the present invention (II) is not determined unambiguously because it varies depending upon the acid value of the component (a) which is the essential component of the curable composition of the present invention (II).

However, the ratio of the number of functional groups capable of curing reaction contained in the component (a) which is the essential component of the curable composition of the present invention (II) to the number of epoxy groups in the component (e) (compound having two or more epoxy groups in one molecule) (functional groups capable of curing reaction/epoxy groups) is preferably in the range of 1/3 to 2/1, more preferably 1/2.5 to 1.5/1. If the ratio is less than 1/3, there is a high possibility of remaining of an unreacted component (e) in a large amount when the curable composition of the present invention (II) is subjected to curing reaction. If the ratio is more than 2/1, unreacted functional groups capable of curing reaction in the component (a) remain in a large amount, sometimes resulting in undesirable electrical insulation performance.

<Other Components>

The curable composition of the present invention (II) can further contain a curing accelerator, and the composition preferably contains it. The curing accelerator is not particularly restricted provided that it is a compound accelerating reaction of the epoxy group of the component (e) with the functional group capable of curing reaction of the component (a). When the functional group capable of curing reaction of the component (a) is a carboxyl group, examples of the curing accelerators include triazine-based compounds such as melamine, acetoguanamine, benzoguanamine, 2,4-diamino-6-methacryloyloxyethyl-5-triazine, 2,4-methacryloyloxyethyl-s-triazine, 2,4-diamino-6-vinyl-s-triazine and 2,4-diamino-6-vinyl-s-triazine.isocyanuric acid adduct; imidazole-based compounds, such as imidazole, 2-methylimidazole, 2-ethyl-4-methylimidazole, 2-phenylimidazole, 2-undecylimidazole, 2-heptadecylimidazole, 1-benzyl-2-methylimidazole, 2-phenyl-4-methylimidazole, 1-cyanoethyl-2-methylimidazole, 1-cyanoethyl-2-ethyl-4-methylimidazole, 1-aminoethyl-2-ethyl-4-methylimidazole, 1-aminoethyl-2-methylimidazole, 1-(cyanoethylaminoethyl)-2-methylimidazole, N-[2-(2-methyl-1-imidazolyl)ethyl]urea, 1-cyanoethyl-2-undecylimidazole, 1-cyanoethyl-2-methylimidazolium trimellitate, 1-cyanoethyl-2-phenylimidazolium trimellitate, 1-cyanoethyl-2-ethyl-4-methylimidazolium trimellitate, 1-cyanoethyl-2-undecylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 1-dodecyl-2-methyl-3-benzylimidazolium chloride, N,N'-bis(2-methyl-1-imidazolylethyl)urea, N,N'-bis(2-methyl-1-imidazolylethyl)adipoamide, 2-phenyl-4-methyl-5-hydroxymethylimidazole, 2-phenyl-4,5-dihydroxymethylimidazole, 2-methylimidazole.isocyanuric acid adduct, 2-phenylimidazole.isocyanuric acid adduct, 2,4-diamino-6-[2'-methylimidazolyl-(1')]-ethyl-s-triazine.isocyanuric acid adduct, 2-methyl-4-formylimidazole, 2-ethyl-4-methyl-5-formylimidazole, 2-phenyl-4-methylformylmidazole, 1-benzyl-2-phenylimidazole, 1,2-dimethylimidazole, 1-(2-hydroxyethyl)imidazole, vinylimidazole, 1-methylimidazole, 1-allylimidazole, 2-ethylimidazole, 2-butylimidazole, 2-butyl-5-hydroxymethylimidazole, 2,3-dihydro-1H-pyrrolo[1,2-a]benzimidazole, 1-benzyl-2-phenylimidazole hydrobromide and 1-dodecyl-2-methyl-3-benzylimidazolium chloride; cycloamidine compounds and derivatives thereof, e.g., diazabicycloalkenes such as 1,5-diazabicyclo(4.3.0)nonene-5 and its salt and 1,8-diazabicyclo(5.4.0)undecene-7 and its salt; tertiary amino group-containing compounds such as triethylenediamine, benzyldimethylamine, triethanolamine, dimethylaminoethanol and tris(dimethylaminomethyl)phenol; organic phosphine compounds such as triphenylphosphine, diphenyl(p-tolyl)phosphine, tris(alkylphenyl)phosphine, tris(alkoxyphenyl)phosphine, tris(alkyl.alkoxyphenyl)phosphine, tris(dialkylphenyl)phosphine, tris(trialkylphenyl)phosphine, tris(tetraalkylphenyl)phosphine, tris(dialkoxyphenyl)phosphine, tris(trialkoxyphenyl)phosphine, tris(tetraalkoxyphenyl)phosphine, trialkylphosphine, dialkylarylphosphine and alkyldiarylphosphine; and dicyan diazide.

These curing accelerators may be used singly or may be used in combination of two or more kinds thereof.

Of these curing accelerators, melamine, imidazole compounds, cycloamidine compounds and derivatives thereof, phosphine-based compounds and amine-based compounds are preferred curing accelerators taking into account good balance between the curing acceleration action and the electrical insulation performance of the cured product of the present invention (III). More preferable are melamine, 1,5-diazabicyclo(4.3.0)nonene-5 and its salt and 1,8-diazabicyclo(5.4.0)undecene-7 and its salt.

The blending amount of the curing accelerator is not particularly restricted provided that the curing acceleration effect can be achieved. However, from the viewpoints of curability of the curable composition of the present invention (II) and electrical insulation properties and water resistance of a cured product obtained by curing the curable composition of the present invention (II), the curing accelerator is preferably blended in an amount of 0.05 to 5 parts by mass, more preferably 0.1 to 3.0 parts by mass, based on 100 parts by mass of the total amount of the component (a) and the component (e) which are the essential components of the curable composition of the present invention (II). If the blending amount is less than 0.05 parts by mass, it is sometimes difficult to cure in a short time. If the amount exceeds 5 parts by mass, electrical insulation properties and water resistance of the cured product obtained by curing the composition are sometimes insufficient.

The curable composition of the present invention (II) is a curable composition from which a cured product having good electrical insulation properties is obtained, and therefore, it can be used as, for example, a composition for an insulation protective film such as a resist for insulative protection of wiring.

When the curable composition of the present invention (II) is used as a composition for a resist for insulative protection of wiring (that is, resist ink composition for insulative protection of wiring), a defoaming agent can be used for the purpose of eliminating bubbles or inhibiting occurrence of bubbles during printing, and it is preferable to use it.

The defoaming agent is not particularly restricted provided that it has, as literally interpreted, a function of eliminating or inhibiting bubbles produced when the resist ink composition for insulative protection of wiring is printed.

Specific examples of the defoaming agents used for the curable composition of the present invention (II) include silicone-based defoaming agents such as BYK-077 (available from BYK Japan K.K.), SN Defoamer 470 (available from San Nopco Limited), TSA750S (available from Momentive Performance Materials Inc.) and Silicone Oil SH-203 (available from Dow Corning Toray Co., Ltd.); acrylic polymerbased defoaming agents such as Dappo SN-348 (available from San Nopco Limited), Dappo SN-354 (available fromSanNopcoLimited), Dappo SN-368 (available from San Nopco Limited) and Disparlon 230HF (available from Kusumoto Chemicals, Ltd.); acetylene diol-based defoaming agents such as Surfinol DF-110D (available from Nisshin Chemical Industry Co., Ltd.) and Surfinol DF-37 (available from Nisshin Chemical Industry Co., Ltd.); and fluorine-containing silicone-based defoaming agents such as FA-630.

To the curable composition of the present invention (II), surface active agents such as leveling agent, and publicly known colorants such as Phthalocyanine Blue, Phthalocyanine Green, Iodine Green, Disazo Yellow, Crystal Violet, Carbon Black and Naphthalene Black, can be further added, when needed.

When it is necessary to inhibit acid value deterioration of the component (a) and discoloration during heating, antioxidants such as phenol-based antioxidant, phosphite-based antioxidant and thioether-based antioxidant can be added, and it is preferable to add them.

Examples of the phenol-based antioxidants include such compounds as represented by the following formulas (4) to (14).

Formula (4)
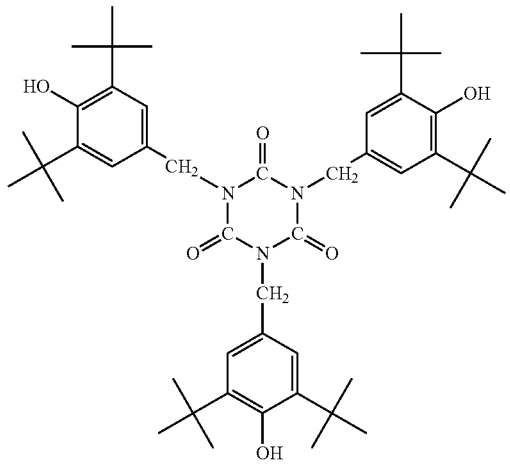

Formula (5)
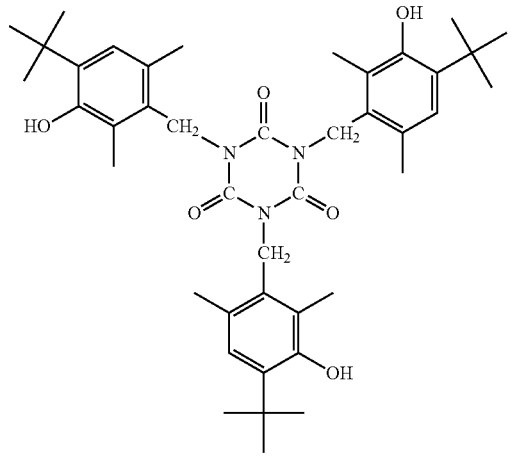

Formula (6)
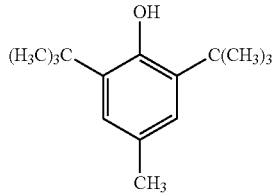

Formula (7)
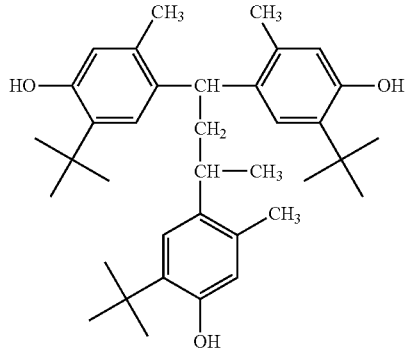

Formula (8)
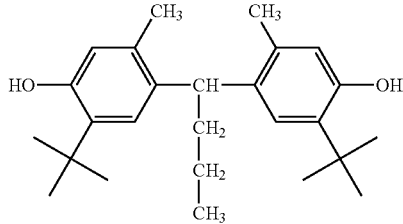

Formula (9)
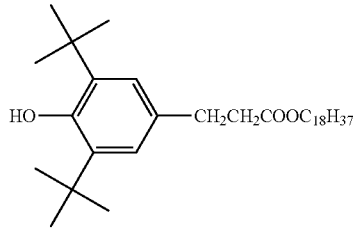

Formula (10)
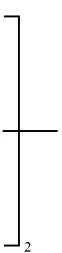

Formula (11)
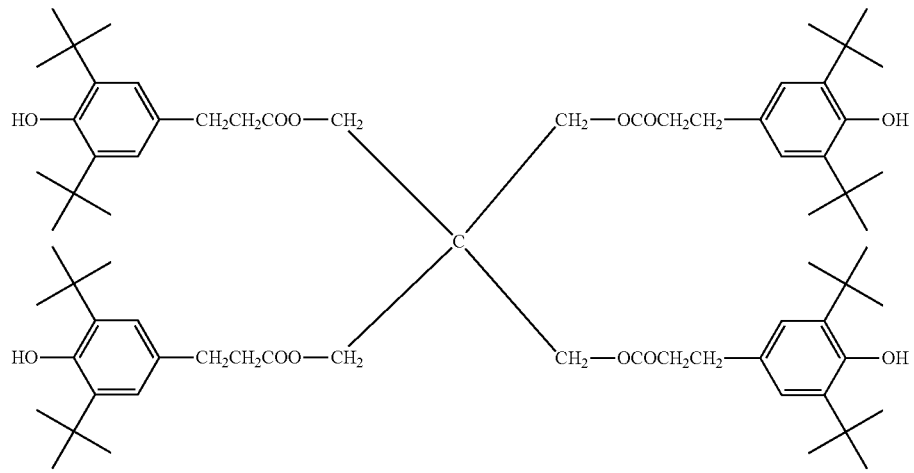
Formula (12)
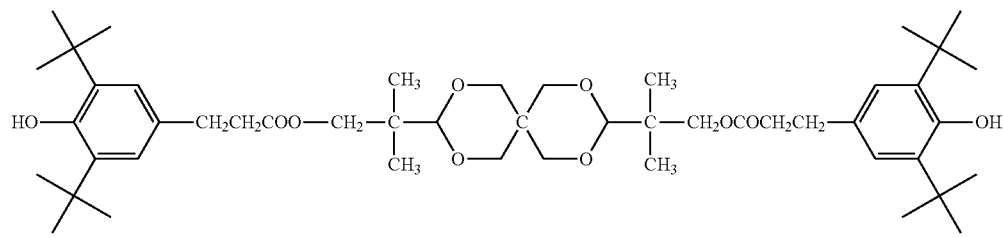
Formula (13)
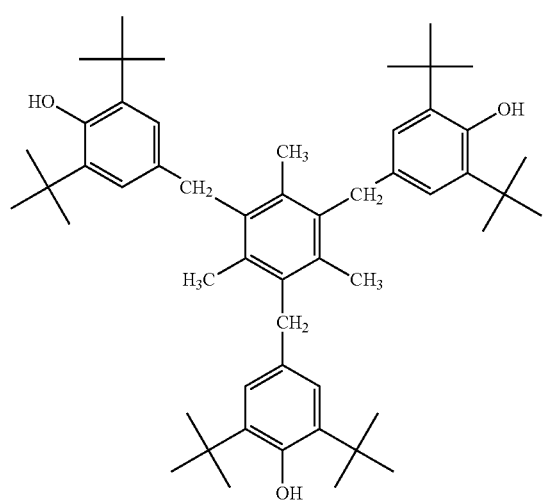
Formula (14)
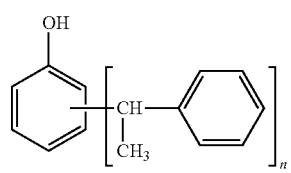

Examples of the phosphite-based antioxidants include compounds represented by the following formulas (15) to (25).

Formula (15)
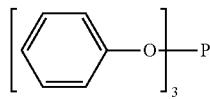

Formula (16)
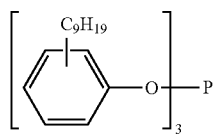

Formula (17)
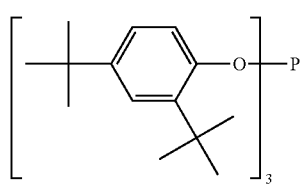

Formula (18)
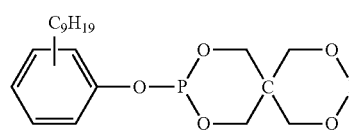

Formula (19)

Formula (20)

Formula (21)
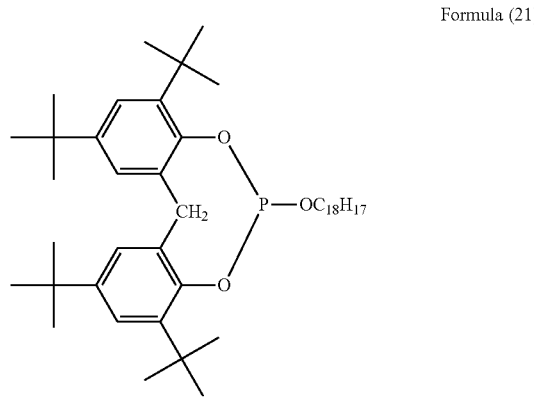

Formula (22)
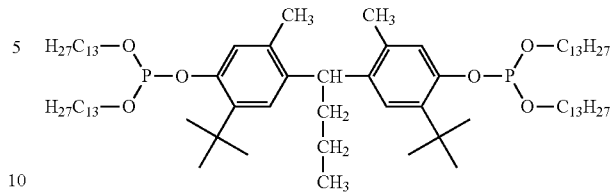

Formula (23)
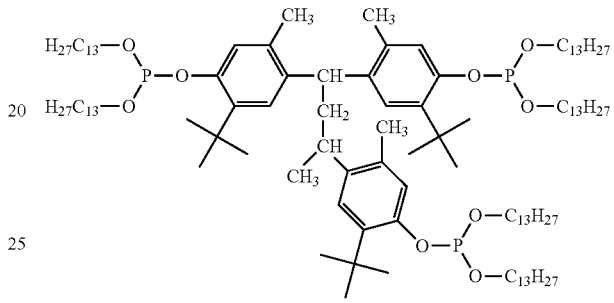

Formula (24)
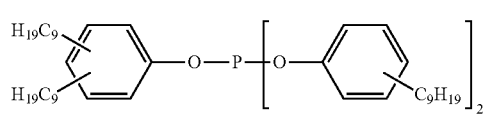

Formula (25)
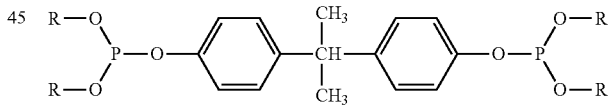

R: alkyl group of $C_{12}$ to $C_{15}$

Examples of the thioether-based antioxidants include compounds represented by the following formulas (26) to (31).

Formula (26)
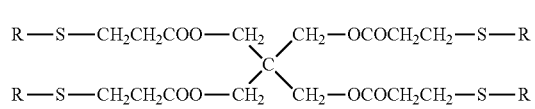

R: alkyl group of $C_{12}$ to $C_{15}$

-continued

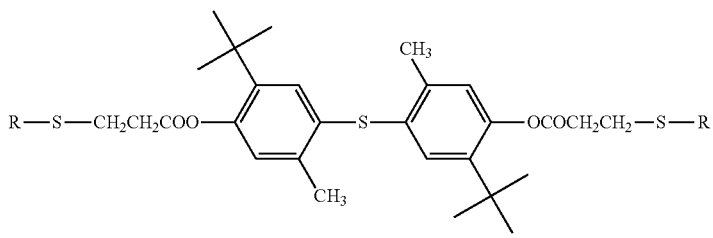

Formula (27)

R: alkyl group of $C_{12}$ to $C_{15}$ $H_{27}C_{13}$—$OCOCH_2CH_2$—$S$—$CH_2CH_2COO$—$C_{13}H_{27}$   Formula (28)

$H_{29}C_{14}$—$OCOCH_2CH_2$—$S$—$CH_2CH_2COO$—$C_{14}H_{29}$   Formula (29)

$H_{25}C_{12}$—$OCOCH_2CH_2$—$S$—$CH_2CH_2COO$—$C_{12}H_{25}$   Formula (30)

$H_{37}C_{18}$—$OCOCH_2CH_2$—$S$—$CH_2CH_2COO$—$C_{18}H_{37}$   Formula (31)

Moreover, a flame retardant and a lubricant can be added, when needed.

The curable composition of the present invention (II) can be obtained by homogeneously kneading and mixing a part or all of the blending components by a roll mill, a bead mill or the like. When a part of the blending components are mixed, the residual components can be mixed in the actual use.

<Viscosity of Curable Composition of Present Invention (II)>

The viscosity of the curable composition of the present invention (II) at 25° C. is usually in the range of 10,000 to 100,000 mPa·s, preferably 20,000 to 60,000 mPa·s. In the present specification, the viscosity of the curable composition of the present invention (II) at 25° C. is a viscosity as measured by the use of a cone/plate type viscometer (manufactured by Brookfield Engineering Laboratories, type: DV-11+ Pro, model number of spindle: CPE-52) after the lapse of 7 minutes from the beginning of rotation under the condition of a rotational speed of 10 rpm.

<Thixotropy Index of Curable Composition of Present Invention (II)>

When the curable composition of the present invention (II) is used as a resist ink composition for insulative protection of wiring, the thixotropy index of the composition is desired to be in a certain range in order to obtain good printability of the curable composition of the present invention (II).

The "thixotropy index" described in this specification is defined as a ratio of a viscosity as measured by the use of a cone/plate type viscometer (manufactured by Brookfield Engineering Laboratories, type: DV-III+Pro, model number of spindle: CPE-52) under the conditions of a temperature of 25° C. and a rotational speed of 1 rpm to a viscosity as measured under the conditions of a temperature of 25° C. and a rotational speed of 10 rpm (viscosity at 1 rpm/viscosity at 10 rpm).

When the curable composition of the present invention (II) is used as a resist ink composition for insulative protection of wiring, the thixotropy index of the curable composition of the present invention (II) is preferably not less than 1.1, more preferably 1.1 to 3.0, particularly preferably 1.1 to 2.5, in order to make the printability of the composition good. If the curable composition of the present invention (II) is used as a solder resist ink composition and if the thixotropy index of the curable composition is less than 1.1, the curable composition flows after the composition is printed, and as a result, a predetermined film thickness cannot be obtained or a printed pattern cannot be maintained in a certain case. If the thixotropy index of the curable composition is more than 3.0, defoaming properties of a coating film of the printed composition are sometimes deteriorated.

[Present Invention (III)]

Next, the cured product of the present invention (III) is described.

The present invention (III) is a cured product obtained by curing the curable composition of the present invention (II).

The cured product of the present invention (III) is generally obtained by removing a part or all of the amount of the solvent contained in the curable composition of the present invention (II) and then promoting the curing reaction by heating. For example, when the cured product of the present invention (III) is obtained as a coating film, the coating film of the cured product can be obtained through the following first to third steps.

First Step

A step of printing the curable composition of the present invention (II) on a substrate or the like to obtain a coating film.

Second Step

A step of placing the coating film obtained in the first step in an atmosphere of 50° C. to 100° C. to evaporate the solvent from the coating film, whereby a coating film from which a part or all of the amount of the solvent has been removed is obtained.

Third Step

A step of thermally curing the coating film obtained in the second step in an atmosphere of 100° C. to 250° C. to obtain a thermally cured coating film (that is, coating film of cured product).

The first step is a step wherein the curable composition of the present invention (II) is printed on a substrate or the like to obtain a coating film. The method for printing the curable composition of the present invention (II) is not particularly restricted, and a coating film can be obtained by coating the curable composition onto a substrate or the like by, for example, screen printing method, roll coater method, spraying method or curtain coater method.

The second step is a step wherein the coating film obtained in the first step is placed in an atmosphere of 50° C. to 100° C. to evaporate the solvent from the coating film, whereby a coating film from which a part or all of the amount of the solvent has been removed is obtained. The time for removing the solvent is preferably not longer than 4 hours, more preferably not longer than 2 hours.

The third step is a step wherein the coating film obtained in the second step is thermally cured in an atmosphere of 100° C. to 250° C. to obtain a thermally cured coating film (that is, coating film of cured product). The time for thermal curing is preferably in the range of 20 minutes to 4 hours, more preferably 30 minutes to 2 hours.

[Present Inventions (IV) and (V)]

Finally, the flexible wiring board of the present invention (IV) and the process for producing a flexible wiring board of the present invention (V) are described.

The present invention (IV) is a flexible wiring board covered with a cured product, which is characterized in that a surface of a flexible wiring board in which wiring is formed on a flexible substrate is partially or wholly covered with the cured product of the present invention (III).

The present invention (V) is a process for producing a flexible wiring board covered with a protective film, which is characterized in that the curable composition of the present invention (II) is printed on at least a part of a wiring pattern portion of a flexible wiring board, said wiring pattern portion having been subjected to tin plating in advance, to form a printed film on the pattern and the printed film is thermally cured at 80 to 130° C. to form a protective film.

The curable composition of the present invention (II) can be used as a resist ink for protection of wiring insulation, and the cured product of the present invention (III) can be used as an insulation protective film. In particular, the cured product can be used as a resist for insulative protection of wiring by covering the whole or a part of wiring of a flexible wiring board such as a chip-on-film with it.

The specific steps of the process for forming a protective film of a flexible wiring board of the present invention (V) are described below. The protective film of the flexible wiring board can be formed through, for example, the following steps A to C.

Step A

A step of screen printing the curable composition of the present invention (II) on a previously tin-plated wiring pattern portion of a flexible wiring board to obtain a printed film.

Step B

A step of placing the printed film obtained in the step A in an atmosphere of 40 to 100° C. to evaporate the solvent from the printed film, whereby a printed film from which a part or all of the amount of the solvent has been removed is obtained.

Step C

A step of thermally curing the printed film obtained in the step B in an atmosphere of 80 to 130° C. to form a protective film of a flexible wiring board.

Taking evaporation rate of the solvent and quick shifting to the subsequent step (step C) into account, the temperature for evaporating the solvent in the step B is usually in the range of 40 to 100° C., preferably 60 to 100° C., more preferably 70 to 90° C. Although the time for evaporating the solvent in the step B is not particularly restricted, it is preferably in the range of 10 to 120 minutes, more preferably 20 to 100 minutes. The operation of the step B is an operation that is carried out when needed, and by carrying out the operation of the step C immediately after the operation of the step A, the curing reaction and the removal of the solvent may be performed at the same time.

The conditions of the thermal curing that is carried out in the step C are as follows. It is carried out at a temperature of 80 to 130° C., from the viewpoints of prevention of diffusion of the plating layer and obtaining low warpage properties and flexibility favorable for the protective film. The thermal curing temperature is preferably in the range of 90 to 130° C., more preferably 110 to 130° C. Although the time for the thermal curing that is carried out in the step C is not particularly restricted, it is preferably in the range of 20 to 150 minutes, more preferably 30 to 120 minutes.

EXAMPLES

The present invention is further described with reference to the following examples, but it should be construed that the present invention is in no way limited to those examples only.

<Measurement of Acid Value>

The solvents (component (b) and (c)) in the polyurethane solution of the present invention (I) were distilled away under reduced pressure by heating to obtain a component (a).

Using the component (a) obtained by the above method, an acid value was measured in accordance with the potentiometric titration method of JIS K0070.

The apparatus used in the potentiometric titration method is described below.

Apparatus name: automatic potentiometric titration apparatus AT-510 manufactured by Kyoto Electronics Manufacturing Co., Ltd.

Electrode: composite glass electrode C-173 manufactured by Kyoto Electronics Manufacturing Co., Ltd.

<Measurement of Number-Average Molecular Weight of Component (a)>

The number-average molecular weight is a number-average molecular weight in terms of polystyrene as measured by GPC, and the measuring conditions of GPC are as follows.

Apparatus name: HPLC Unit HSS-2000 manufactured by JASCO Corporation

Column: Shodex Column LF-804

Mobile phase: tetrahydrofuran

Flow rate: 1.0 mL/min

Detector: RI-2031Plus manufactured by JASCO Corporation

Temperature: 40.0° C.

Sample quantity: Sample loop 100 μl

Sample concentration: adjusted to about 0.1% by mass

<Measurement of Viscosity of Component (a)-Containing Solution>

Viscosity of the polyurethane solution was measured in the following manner.

Using about 0.8 g of a polyurethane solution, viscosity of the solution after the lapse of 7 minutes from the beginning of measurement was measured by a cone/plate type viscometer (manufactured by Brookfield Engineering Laboratories, type: DV-II+Pro, model number of spindle: CPE-52) under the conditions of a temperature of 25.0° C. and a rotational speed of 5 rpm.

<Measurement of Viscosity of Curable Composition>

Viscosity of the curable composition was measured in the following manner.

Using about 0.6 g of a curable composition, viscosity of the composition after the lapse of 7 minutes from the beginning of measurement was measured by a cone/plate type viscometer (manufactured by Brookfield Engineering Laboratories, type: DV-II+Pro, model number of spindle: CPE-52) under the conditions of a temperature of 25.0° C. and a rotational speed of 10 rpm.

<Measurement of Thixotropy Index>

Thixotropy index of the curable composition was measured in the following manner.

Using about 0.6 g of a curable composition, viscosity of the composition after the lapse of 7 minutes from the beginning of measurement was measured by a cone/plate type viscometer (manufactured by Brookfield Engineering Laboratories, type: DV-II+Pro, model number of spindle: CPE-52) under the conditions of a temperature of 25.0° C. and a rotational speed of 10 rpm. Thereafter, viscosity of the composition after the lapse of 7 minutes from the beginning of measurement was measured under the conditions of a temperature of 25.0° C. and a rotational speed of 1 rpm.

The thixotropy index was determined by the following calculation.

Determination of thixotropy index:

Thixotropy index=[viscosity at 1 rpm]÷[viscosity at 10 rpm]

Synthesis of Polyurethane Having a Carboxyl Group and a Carbonate Bond

Synthesis Example 1

A reaction container equipped with a stirring device, a thermometer and a condenser, was charged with 248.0 g of C-1015N ((available from Kuraray Co., Ltd.), a mixture of (poly)carbonate diol and raw material diols (1,9-nonanediol and 2-methyl-1,8-octanediol), molar ratio of raw material diols used as raw material for synthesizing C-1015N: 15:85 (1,9-nonanediol:2-methyl-1,8-octanediol, hydroxyl value: 112.3 mgKOH/g, residual concentration of 1,9-nonanediol: 2.1% by mass, residual concentration of 2-methyl-1,8-octanediol: 9.3% by mass), 47.5 g of 2,2-dimethylolbutanoic acid (available from Nippon Kasei Chemical Co., Ltd.) as carboxyl group-containing diol, 2.7 g of trimethylolethane (available from Mitsubishi Gas Chemical Company, Inc.) as polyol other than (poly)carbonate polyol and carboxyl group-containing diol, and 467.5 g of γ-butyrolactone (available from Mitsubishi Chemical Corporation) and 82.5 g of diethylene glycol diethyl ether (available from Nippon Nyukazai Co., Ltd.) as solvents, and they were heated to 100° C. to dissolve all the raw materials.

The temperature of the reaction solution was lowered down to 90° C., and by the use of a dropping funnel, 150.4 g of methylenebis (4-cyclohexyl isocyanate) (available from Sumika Bayer Urethane Co., Ltd., trade name: Desmodur-W) was dropwise added as a polyisocyanate compound over a period of 30 minutes. The reaction was carried out at 120° C. for 8 hours, and after it was confirmed that isocyanate had been almost consumed, 1.5 g of ethanol (available from Wako Pure Chemical Industries, Ltd.) was dropwise added. The reaction was further carried out at 80° C. for 3 hours to obtain a polyurethane solution having a carboxyl group and a carbonate bond (referred to as a "polyurethane solution A1" hereinafter).

The viscosity of the resulting polyurethane solution A1 was 280,000 mPa·s. The number-average molecular weight of polyurethane having a carboxyl group and a carbonate bond (referred to as "polyurethane AU1" hereinafter) contained in the polyurethane solution A1 was 14,000, and the acid value of the polyurethane AU1 was 40.0 mg-KOH/g.

The solid content concentration of the polyurethane solution A1 was 45.0% by mass.

Synthesis Example 2

A reaction container equipped with a stirring device, a thermometer and a condenser, was charged with 220.4 g of C-1015N ((available from Kuraray Co., Ltd.), a mixture of (poly)carbonate diol and raw material diols (1,9-nonanediol and 2-methyl-1,8-octanediol), molar ratio of raw material diols used as raw material for synthesizing C-1015N: 15:85 (1,9-nonanediol:2-methyl-1,8-octanediol), hydroxyl value: 112.3 mgKOH/g, residual concentration of 1,9-nonanediol: 2.1% by mass, residual concentration of 2-methyl-1,8-octanediol: 9.3% by mass), 42.2 g of 2,2-dimethylolbutanoic acid (available from Nippon Kasei Chemical Co., Ltd.) as carboxyl group-containing diol, 2.4 g of trimethylolethane (available from Mitsubishi Gas Chemical Company, Inc.) as polyol other than (poly)carbonate polyol and carboxyl group-containing diol, and 510.0 g of γ-butyrolactone (available from Mitsubishi Chemical Corporation) and 90.0 g of diethylene glycol diethyl ether (available from Nippon Nyukazai Co., Ltd.) as solvents, and they were heated to 100° C. to dissolve all the raw materials.

The temperature of the reaction solution was lowered down to 90° C., and by the use of a dropping funnel, 133.7 g of methylenebis (4-cyclohexyl isocyanate) (available from Sumika Bayer Urethane Co., Ltd., trade name: Desmodur-W) was dropwise added as a polyisocyanate compound over a period of 30 minutes. The reaction was carried out at 120° C. for 9 hours, and after it was confirmed that isocyanate had been almost consumed, 1.3 g of ethanol (available from Wako Pure Chemical Industries, Ltd.) was dropwise added. The reaction was further carried out at 80° C. for 3 hours to obtain a polyurethane solution having a carboxyl group and a carbonate bond (referred to as a "polyurethane solution A2" hereinafter).

The viscosity of the resulting polyurethane solution A2 was 100,500 mPa·s. The number-average molecular weight of polyurethane having a carboxyl group and a carbonate bond (referred to as "polyurethane AU2" hereinafter) contained in the polyurethane solution A2 was 14,000, and the acid value of the polyurethane AU2 was 40.0 mg-KOH/g.

The solids concentration of the polyurethane solution A2 was 40.0% by mass.

Synthesis Example 3

A reaction container equipped with a stirring device, a thermometer and a condenser, was charged with 250.9 g of C-1015N ((available from Kuraray Co., Ltd.) a mixture of (poly)carbonate diol and raw material diols (1,9-nonanediol and 2-methyl-1,8-octanediol, molar ratio of raw material diols used as raw material for synthesizing C-1015N: 15:85 (1,9-nonanediol:2-methyl-1,8-octanediol), hydroxyl value: 112.3 mgKOH/g, residual concentration of 1,9-nonanediol: 2.1% by mass, residual concentration of 2-methyl-1,8-octanediol: 9.3% by mass), 47.5 g of 2,2-dimethylolbutanoic acid (available from Nippon Kasei Chemical Co., Ltd.) as carboxyl group-containing diol, 2.7 g of trimethylolethane (available from Mitsubishi Gas Chemical Company, Inc.) as polyol other than (poly)carbonate polyol and carboxyl group-containing diol, and 467.5 g of γ-butyrolactone (available from Mitsubishi Chemical Corporation) and 82.5 g of diethylene glycol diethyl ether (available from Nippon Nyukazai Co., Ltd.) as solvents, and they were heated to 100° C. to dissolve all the raw materials.

The temperature of the reaction solution was lowered down to 90° C., and by the use of a dropping funnel, 147.4 g of methylenebis(4-cyclohexyl isocyanate) (available from Sumika Bayer Urethane Co., Ltd., Desmodur-W) was dropwise added as a polyisocyanate compound over a period of 30 minutes. The reaction was carried out at 120° C. for 7 hours, and after it was confirmed that isocyanate had been almost consumed, 1.5 g of ethanol (available from Wako Pure Chemical Industries, Ltd.) was dropwise added. The reaction was further carried out at 80° C. for 3 hours to obtain a polyurethane solution having a carboxyl group and a carbonate bond (referred to as a "polyurethane solution A3" hereinafter).

The viscosity of the resulting polyurethane solution A3 was 99,000 mPa·s. The number-average molecular weight of polyurethane having a carboxyl group and a carbonate bond (referred to as "polyurethane AU3" hereinafter) contained in the polyurethane solution A3 was 11,000, and the acid value of the polyurethane AU3 was 40.0 mg-KOH/g.

The solid content concentration of the polyurethane solution A3 was 45.0% by mass.

Synthesis Example 4

A reaction container equipped with a stirring device, a thermometer and a condenser, was charged with 252.8 g of C-1015N ((available from Kuraray Co., Ltd.), a mixture of (poly)carbonate diol and raw material diols (1,9-nonanediol and 2-methyl-1,8-octanediol), molar ratio of raw material diols used as raw material for synthesizing C-1015N: 15:85 (1,9-nonanediol:2-methyl-1,8-octanediol), hydroxyl value: 112.3 mgKOH/g, residual concentration of 1,9-nonanediol: 2.1% by mass, residual concentration of 2-methyl-1,8-octanediol: 9.3% by mass), 47.5 g of 2,2-dimethylolbutanoic acid (available from Nippon Kasei Chemical Co., Ltd.) as carboxyl group-containing diol, and 467.5 g of γ-butyrolactone (available from Mitsubishi Chemical Corporation) and 82.5 g of diethylene glycol diethyl ether (available from Nippon Nyukazai Co., Ltd.) as solvents, and they were heated to 100° C. to dissolve all the raw materials.

The temperature of the reaction solution was lowered down to 90° C., and by the use of a dropping funnel, 145.6 g of methylenebis(4-cyclohexyl isocyanate) (available from Sumika Bayer Urethane Co., Ltd., trade name: Desmodur-W) was dropwise added as a polyisocyanate compound over a period of 30 minutes. The reaction was carried out at 120° C. for 8 hours, and after it was confirmed that isocyanate had been almost consumed, 4.0 g of isobutanol (available from Wako Pure Chemical Industries, Ltd.) was dropwise added. The reaction was further carried out at 80° C. for 3 hours to obtain a polyurethane solution having a carboxyl group and a carbonate bond (referred to as a "polyurethane solution A4" hereinafter).

The viscosity of the resulting polyurethane solution A4 was 93,000 mPa·s. The number-average molecular weight of polyurethane having a carboxyl group and a carbonate bond (referred to as "polyurethane AU4" hereinafter) contained in the polyurethane solution A4 was 13,000, and the acid value of the polyurethane AU4 was 40.0 mg-KOH/g.
The solid content concentration of the polyurethane solution A4 was 45.0% by mass.

Comparative Synthesis Example 1

A reaction container equipped with a stirring device, a thermometer and a condenser, was charged with 252.8 g of C-1015N ((available from Kuraray Co., Ltd.), a mixture of (poly)carbonate diol and raw material diols (1,9-nonanediol and 2-methyl-1,8-octanediol), molar ratio of raw material diols used as raw material for synthesizing C-1015N: 15:85 (1,9-nonanediol:2-methyl-1,8-octanediol), hydroxyl value: 112.3 mgKOH/g, residual concentration of 1,9-nonanediol: 2.1% by mass, residual concentration of 2-methyl-1,8-octanediol: 9.3% by mass), 47.5 g of 2,2-dimethylolbutanoic acid (available from Nippon Kasei Chemical Co., Ltd.) as carboxyl group-containing diol, and 550.0 g of diethylene glycol monoethyl ether acetate (available from Daicel Chemical Industries, Ltd.) as a solvent, and they were heated to 100° C. to dissolve all the raw materials.

The temperature of the reaction solution was lowered down to 90° C., and by the use of a dropping funnel, 145.6 g of methylenebis(4-cyclohexyl isocyanate) (available from Sumika Bayer Urethane Co., Ltd., trade name: Desmodur-W) was dropwise added as a polyisocyanate compound over a period of 30 minutes. The reaction was carried out at 120° C. for 8 hours, and after it was confirmed that isocyanate had been almost consumed, 4.0 g of isobutanol (available from Wako Pure Chemical Industries, Ltd.) was dropwise added. The reaction was further carried out at 80° C. for 3 hours to obtain a polyurethane solution having a carboxyl group and a carbonate bond (referred to as a "polyurethane solution B1" hereinafter).

The viscosity of the resulting polyurethane solution B1 was 70,000 mPa·s. The number-average molecular weight of polyurethane having a carboxyl group and a carbonate bond (referred to as "polyurethane BU1" hereinafter) contained in the polyurethane solution B1 was 12,000, and the acid value of the polyurethane BU1 was 40.0 mg-KOH/g.
The solid content concentration of the polyurethane solution B1 was 45.0% by mass.

Comparative Synthesis Example 2

A reaction container equipped with a stirring device, a thermometer and a condenser, was charged with 252.8 g of C-1015N ((available from Kuraray Co., Ltd.), a mixture of (poly)carbonate diol and raw material diols (1,9-nonanediol and 2-methyl-1,8-octanediol), molar ratio of raw material diols used as raw material for synthesizing C-1015N: 15:85 (1,9-nonanediol:2-methyl-1,8-octanediol), hydroxyl value: 112.3 mgKOH/g, residual concentration of 1,9-nonanediol: 2.1% by mass, residual concentration of 2-methyl-1,8-oc-tanediol: 9.3% by mass), 47.5 g of 2,2-dimethylolbutanoic acid (available from Nippon Kasei Chemical Co., Ltd.) as carboxyl group-containing diol, and 467.5 g of γ-butyrolactone (available from Mitsubishi Chemical Corporation) and 82.5 g of diethylene glycol monoethyl ether acetate (available from Daicel Chemical Industries, Ltd.) as solvents, and they were heated to 100° C. to dissolve all the raw materials.

The temperature of the reaction solution was lowered down to 90° C., and by the use of a dropping funnel, 145.6 g of methylenebis(4-cyclohexyl isocyanate) (available from Sumika Bayer Urethane Co., Ltd., trade name: Desmodur-W) was dropwise added as a polyisocyanate compound over a period of 30 minutes. The reaction was carried out at 120° C. for 8 hours, and after it was confirmed that isocyanate had been almost consumed, 4.0 g of isobutanol (available from Wako Pure Chemical Industries, Ltd.) was dropwise added. The reaction was further carried out at 80° C. for 3 hours to obtain a polyurethane solution having a carboxyl group and a carbonate bond (referred to as a "polyurethane solution B2" hereinafter).

The viscosity of the resulting polyurethane solution B2 was 93,000 mPa·s. The number-average molecular weight of polyurethane having a carboxyl group and a carbonate bond (referred to as "polyurethane BU2" hereinafter) contained in the polyurethane solution B2 was 13,000, and the acid value of the polyurethane BU2 was 40.0 mg-KOH/g.
The solid content concentration of the polyurethane solution B2 was 45.0% by mass.

Comparative Synthesis Example 3

A reaction container equipped with a stirring device, a thermometer and a condenser, was charged with 252.8 g of C-1015N ((available from Kuraray Co., Ltd.), a mixture of (poly)carbonate diol and raw material diols (1,9-nonanediol and 2-methyl-1,8-octanediol), molar ratio of raw material diols used as raw material for synthesizing C-1015N: 15:85 (1,9-nonanediol:2-methyl-1,8-octanediol, hydroxyl value: 112.3 mgKOH/g, residual concentration of 1,9-nonanediol: 2.1% by mass, residual concentration of 2-methyl-1,8-octanediol: 9.3% by mass), 47.5 g of 2,2-dimethylolbutanoic acid (available from Nippon Kasei Chemical Co., Ltd.) as carboxyl group-containing diol, and 550.0 g of γ-butyrolactone (available from Mitsubishi Chemical Corporation) as a solvent, and they were heated to 100° C. to dissolve all the raw materials.

The temperature of the reaction solution was lowered down to 90° C., and by the use of a dropping funnel, 145.6 g of methylenebis(4-cyclohexyl isocyanate) (available from Sumika Bayer Urethane Co., Ltd., trade name: Desmodur-W) was dropwise added as a polyisocyanate compound over a period of 30 minutes. The reaction was carried out at 120° C. for 8 hours, and after it was confirmed that isocyanate had been almost consumed, 4.0 g of isobutanol (available from Wako Pure Chemical Industries, Ltd.) was dropwise added. The reaction was further carried out at 80° C. for 3 hours to obtain a polyurethane solution having a carboxyl group and a carbonate bond (referred to as a "polyurethane solution B3" hereinafter).

The viscosity of the resulting polyurethane solution B3 was 97,000 mPa·s. The number-average molecular weight of polyurethane having a carboxyl group and a carbonate bond (referred to as "polyurethane BU3" hereinafter) contained in the polyurethane solution B3 was 14,000, and the acid value of the polyurethane BU3 was 40.0 mg-KOH/g.

The solid content concentration of the polyurethane solution B3 was 45.0% by mass.

Comparative Synthesis Example 4

A reaction container equipped with a stirring device, a thermometer and a condenser, was charged with 248.0 g of C-1015N ((available from Kuraray Co., Ltd, a mixture of (poly)carbonate diol and raw material diols (1,9-nonanediol and 2-methyl-1,8-octanediol), molar ratio of raw material diols used as raw material for synthesizing C-1015N: 15:85 (1,9-nonanediol:2-methyl-1,8-octanediol), hydroxyl value: 112.3 mgKOH/g, residual concentration of 1,9-nonanediol: 2.1% by mass, residual concentration of 2-methyl-1,8-octanediol: 9.3% by mass), 47.5 g of 2,2-dimethylolbutanoic acid (available from Nippon Kasei Chemical Co., Ltd.) as carboxyl group-containing diol, 2.7 g of trimethylolethane (available from Mitsubishi Gas Chemical Company, Inc.) as polyol other than (poly)carbonate polyol and carboxyl group-containing diol, and 467.5 g of γ-butyrolactone (available from Mitsubishi Chemical Corporation) and 82.5 g of diethylene glycol monoethyl ether acetate (available from Daicel Chemical Industries, Ltd.) as solvents, and they were heated to 100° C. to dissolve all the raw materials.

The temperature of the reaction solution was lowered down to 90° C., and by the use of a dropping funnel, 150.4 g of methylenebis(4-cyclohexyl isocyanate) (available from Sumika Bayer Urethane Co., Ltd., trade name: Desmodur-W) was dropwise added as a polyisocyanate compound over a period of 30 minutes. The reaction was carried out at 120° C. for 8 hours, and after it was confirmed that isocyanate had been almost consumed, 1.5 g of ethanol (available from Wako Pure Chemical Industries, Ltd.) was dropwise added. The reaction was further carried out at 80° C. for 3 hours to obtain a polyurethane solution having a carboxyl group and a carbonate bond (referred to as a "polyurethane solution B4" hereinafter).

The viscosity of the resulting polyurethane solution B4 was 290,000 mPa·s. The number-average molecular weight of polyurethane having a carboxyl group and a carbonate bond (referred to as "polyurethane BU4" hereinafter) contained in the polyurethane solution B4 was 14,000, and the acid value of the polyurethane BU4 was 40.0 mg-KOH/g.

The solid content concentration of the polyurethane solution B4 was 45.0% by mass.

Comparative Synthesis Example 5

A reaction container equipped with a stirring device, a thermometer and a condenser, was charged with 178.1 g of C-1015N ((available from Kuraray Co., Ltd.), a mixture of (poly)carbonate diol and raw material diols (1,9-nonanediol and 2-methyl-1,8-octanediol), molar ratio of raw material diols used as raw material for synthesizing C-1015N: 15:85 (1,9-nonanediol:2-methyl-1,8-octanediol, hydroxyl value: 112.3 mgKOH/g, residual concentration of 1,9-nonanediol: 2.1% by mass, residual concentration of 2-methyl-1,8-octanediol: 9.3% by mass), 0.23 g of dioctyltin dilaurate (available from Nitto Kasei Co., Ltd., trade name: Neostan U-810), 191.3 g of γ-butyrolactone and 33.8 g of diethylene glycol diethyl ether, and they were heated to 80° C. to dissolve all the raw materials. By the use of a dropping funnel, 47.0 g of methylenebis(4-cyclohexyl isocyanate) was dropwise added over a period of 5 minutes. After the dropwise addition was completed, the reaction was carried out at 80° C. for 4 hours, and after it was confirmed that isocyanate had been almost consumed, 2.0 g of isobutanol (available from Wako Pure Chemical Industries, Ltd.) was dropwise added. The reaction was further carried out at 80° C. for 1 hour to obtain a polyurethane solution (referred to as a "polyurethane solution B5" hereinafter).

The viscosity of the resulting polyurethane solution B5 was 340,000 mPa·s. The number-average molecular weight of polyurethane having a carbonate bond (referred to as "polyurethane BU5" hereinafter) contained in the polyurethane solution B5 was 19,000, and the acid value of the polyurethane BU5 was 0 mg-KOH/g.

The solid content concentration of the polyurethane solution B5 was 50.0% by mass.

Blending Example 1

111.1 g of the polyurethane solution A1, 5.0 g of a silica powder (available from Nippon Aerosil Co., Ltd., trade name: Aerosil R-974), 0.36 g of melamine (available from Nissan Chemical Industries, Ltd.) as a curing accelerator and 0.70 g of a defoaming agent (available from Momentive Performance Materials Inc., trade name: TSA750S) were mixed, and by the use of a three-roll mill (manufactured by Inoue Manufacturing Co., Ltd., type: S-4Sex11), mixing of the polyurethane solution A1 with the silica powder, the curing accelerator and the defoaming agent was carried out. The resulting blend was taken as a main agent blend C1.

Blending Examples 2 to 4 and Comparative Blending Examples 1 to 5

In accordance with the formulation shown in Table 1, blending was carried out in the same manner as in Blending Example 1. The blends prepared in Blending Examples 2 to 4 were taken as main agent blends C2 to C4, respectively, and the blends prepared in Comparative Blending Examples 1 to 5 were taken as main agent blends D1 to D5, respectively. The unit of each numerical value in the table is g.

TABLE 1

|  | Blending Ex. 1 (Main agent blend C1) | Blending Ex. 2 (Main agent blend C2) | Blending Ex. 3 (Main agent blend C3) | Blending Ex. 4 (Main agent blend C4) |
|---|---|---|---|---|
| Polyurethane solution A1 (solid content concentration: 45.0% by mass) | 111.1 | | | |
| Polyurethane solution A2 (solid content concentration: 40.0% by mass) | | 111.1 | | |
| Polyurethane solution A3 (solid content concentration: 45.0% by mass) | | | 111.1 | |
| Polyurethane solution A4 (solid content concentration: 45.0% by mass) | | | | 111.1 |
| Polyurethane solution B1 (solid content concentration: 45.0% by mass) | | | | |
| Polyurethane solution B2 (solid content concentration: 45.0% by mass) | | | | |
| Polyurethane solution B3 (solid content concentration: 45.0% by mass) | | | | |
| Polyurethane solution B4 (solid content concentration: 45.0% by mass) | | | | |
| Polyurethane solution B5 (solid content concentration: 50.0% by mass) | | | | |
| Silica powder Aerosil R-974 | 5.00 | 5.00 | 5.00 | 5.00 |
| Curing accelerator Melamine | 0.36 | 0.36 | 0.36 | 0.36 |
| Defoaming agent TSA750S | 0.70 | 0.70 | 0.70 | 0.70 |

|  | Comp. Blending Ex. 1 (Main agent blend D1) | Comp. Blending Ex. 2 (Main agent blend D2) | Comp. Blending Ex. 3 (Main agent blend D3) | Comp. Blending Ex. 4 (Main agent blend D4) | Comp. Blending Ex. 5. (Main agent) |
|---|---|---|---|---|---|
| Polyurethane solution A1 (solid content concentration: 45.0% by mass) | | | | | |
| Polyurethane solution A2 (solid content concentration: 40.0% by mass) | | | | | |
| Polyurethane solution A3 (solid content concentration: 45.0% by mass) | | | | | |
| Polyurethane solution A4 (solid content concentration: 45.0% by mass) | | | | | |
| Polyurethane solution B1 (solid content concentration: 45.0% by mass) | 111.1 | | | | |
| Polyurethane solution B2 (solid content concentration: 45.0% by mass) | | 111.1 | | | |
| Polyurethane solution B3 (solid content concentration: 45.0% by mass) | | | 111.1 | | |
| Polyurethane solution B4 (solid content concentration: 45.0% by mass) | | | | 111.1 | |
| Polyurethane solution B5 (solid content concentration: 50.0% by mass) | | | | | 100.00 |
| Silica powder Aerosil R-974 | 5.00 | 5.00 | 5.00 | 5.00 | 5.00 |
| Curing accelerator Melamine | 0.36 | 0.36 | 0.36 | 0.36 | 0.36 |
| Defoaming agent TSA750S | 0.70 | 0.70 | 0.70 | 0.70 | 0.70 |

<Preparation of Solution Containing Component (E)>

Into a container equipped with a stirrer, a thermometer and a condenser, 300 g of an epoxy resin having a structure of the following formula (2) (available from DIC Corporation, grade name: HP-7200H, epoxy equivalent: 278 g/eq), 180 g of γ-butyrolactone (available from Mitsubishi Chemical Corporation) and 120 g of diethylene glycol diethyl ether (available from Toho Chemical Industry Co., Ltd.) were added, and stirring was started.

With continuing stirring, the temperature in the container was raised to 70° C. by the use of an oil bath. After the internal temperature was raised to 70° C., stirring was continued for 30 minutes. Thereafter, it was confirmed that HP-7200H had been completely dissolved, and then the temperature was lowered down to room temperature to obtain a HP-7200H-containing solution having a concentration of 50% by mass. This solution is taken as a curing agent solution E1.

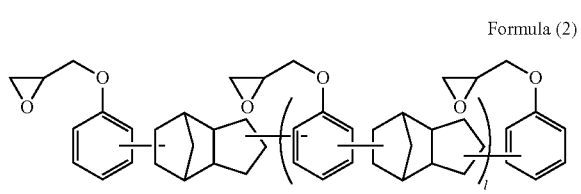

Formula (2)

Into the above formula, l is a natural number.

In a container equipped with a stirrer, a thermometer and a condenser, 300 g of an epoxy resin having a structure of the above formula (2) (available from DIC Corporation, grade name: HP-7200H, epoxy equivalent: 278 g/eq) and 300 g of diethylene glycol monoethyl ether acetate (available from Daicel Chemical Industries, Ltd.) were added, and stirring was started.

With continuing stirring, the temperature in the container was raised to 70° C. by the use of an oil bath. After the internal temperature was raised to 70° C., stirring was continued for 30 minutes. Thereafter, it was confirmed that HP-7200H had been completely dissolved, and then the temperature was lowered down to room temperature to obtain a HP-7200H-containing solution having a concentration of 50% by mass. This solution is taken as a curing agent solution E2.

<Mixing of Main Agent Blend with Solution Containing Curing Agent>

Blending Example 1 for Curable Composition

In a plastic container, 117.2 g of the main agent blend C1 and 19.8 g of the curing agent solution E1 were placed. In order to conform the viscosity of the resulting curable composition to that of the curable compositions of the later-described other blending examples and comparative blending examples, 3.0 g of γ-butyrolactone (available from Mitsubishi Chemical Corporation) and 2.0 g of diethylene glycol diethyl ether (available from Nippon Nyukazai Co., Ltd.) were further added as solvents. Mixing was carried out by stirring them at room temperature for 5 minutes by the use of a spatula to obtain a curable composition (referred to as a "curable composition F1" hereinafter). The viscosity of the curable composition F1 was 50,000 mPa·s. The thixotropy index was 1.35.

Blending Example 2 for Curable Composition

In a plastic container, 117.2 g of the main agent blend C2 and 17.6 g of the curing agent solution E1 were placed. Mixing was carried out in the same manner as in Blending Example 1 for curable composition to obtain a curable composition (referred to as a "curable composition F2" hereinafter). The viscosity of the curable composition F2 was 50,500 mPa·s. The thixotropy index was 1.38.

Blending Example 3 for Curable Composition

In a plastic container, 117.2 g of the main agent blend C3 and 19.8 g of the curing agent solution E1 were placed. Mixing was carried out by stirring them at room temperature for 5 minutes by the use of a spatula to obtain a curable composition (referred to as a "curable composition F3" hereinafter). The viscosity of the curable composition F3 was 50,100 mPa·s. The thixotropy index was 1.33.

Blending Example 4 for Curable Composition

A curable composition (referred to as a "curable composition F4" hereinafter) was obtained in the same manner as in Blending Example 3 for curable composition, except that the main agent blend C3 of the Blending Example 3 for curable composition was replaced with the main agent blend C4. The viscosity of the curable composition F4 was 49,000 mPa·s. The thixotropy index was 1.35.

Comparative Blending Example 1 for Curable Composition

A curable composition (referred to as a "curable composition G1" hereinafter) was obtained in the same manner as in Blending Example 3 for curable composition, except that the main agent blend C3 of the Blending Example 3 for curable composition was replaced with the main agent blend D1 and the curing agent solution E1 was replaced with the curing agent solution E2. The viscosity of the curable composition G1 was 49,000 mPa·s. The thixotropy index was 1.34.

Comparative Blending Example 2 for Curable Composition

A curable composition (referred to as a "curable composition G2" hereinafter) was obtained in the same manner as in Blending Example 3 for curable composition, except that the main agent blend C3 of the Blending Example 3 for curable composition was replaced with the main agent blend D2 and the curing agent solution E1 was replaced with the curing agent solution E2. The viscosity of the curable composition G2 was 50,300 mPa·s. The thixotropy index was 1.35.

Comparative Blending Example 3 for Curable Composition

A curable composition (referred to as a "curable composition G3" hereinafter) was obtained in the same manner as in Blending Example 3 for curable composition, except that the main agent blend C3 of the Blending Example 3 for curable composition was replaced with the main agent blend D3 and the curing agent solution E1 was replaced with the curing agent solution E2. The viscosity of the curable composition G3 was 50,500 mPa·s. The thixotropy index was 1.36.

Comparative Blending Example 4 for Curable Composition

In a plastic container, 117.2 g of the main agent blend D4 and 19.8 g of the curing agent solution E2 were placed.

Moreover, 3.0 g of γ-butyrolactone (available from Mitsubishi Chemical Corporation) and 2.0 g of diethylene glycol monoethyl ether acetate (available from Daicel Chemical Industries, Ltd.) were added as solvents. Mixing was carried out by stirring them at room temperature for 5 minutes by the use of a spatula to obtain a curable composition (referred to as a "curable composition G4" hereinafter). The viscosity of the curable composition G4 was 50,100 mPa·s. The thixotropy index was 1.38.

Comparative Blending Example 5 for Curable Composition

In a plastic container, 106.1 g of the main agent blend D5 and 19.8 g of the curing agent solution E2 were placed. Moreover, 3.0 g of γ-butyrolactone (available from Mitsubishi Chemical Corporation) and 2.0 g of diethylene glycol monoethyl ether acetate (available from Daicel Chemical Industries, Ltd.) were added as solvents. Mixing was carried out by stirring them at room temperature for 5 minutes by the use of a spatula to obtain a curable composition (referred to as a "curable composition G5" hereinafter). The viscosity of the curable composition G5 was 50,300 mPa·s. The thixotropy index was 1.34.

Examples 1-1 to 1-4, Comparative Examples 1-1 to 1-5

Using the polyurethane solutions A1 to A4 and the polyurethane solutions B1 to B5, evaluation of storage stability was carried out by the method described below. The results are set forth in Table 2.
Storage Stability Evaluation Method
The polyurethane solution was allowed to stand still at 5° C. for 1 week, and the evaluation was carried out from the turbidity of the solution according to the following criteria.
A: The solution is not turbid.
B: The solution is slightly turbid.
C: The solution is turbid.

warpage properties and evaluation of long-term electrical insulation reliability were carried out by the methods described below. The results are set forth in Table 3.
<Evaluation of Printability>
Onto a flexible wiring board obtained by tin plating of a substrate having a shape of a fine comb-like pattern (copper line width/copper line space=15 μm/15 μm) described in JPCA-ET01, said substrate having been produced by etching a flexible copper-clad laminate (manufactured by Sumitomo Metal Mining Co., Ltd., grade name: Esperflex US, thickness of copper: 8 μm, thickness of polyimide: 38 μm), the curable composition F1 was coated by screen printing using a #100 mesh polyester screen. The resulting coating film was dried at 80° C. for 30 minutes and then thermally cured at 120° C. for 1 hour. After curing, the fine line portion was observed by a microscope, and a bleed quantity, i.e., distance from the printed edge surface to the tip of the composition having bled, was measured, followed by evaluation according to the following criteria.
A: The bleed quantity is not more than 40 μm.
B: The bleed quantity is more than 40 μm but not more than 80 μm.
C: The bleed quantity is more than 80 μm.
The results are set forth in Table 3.
Using the curable composition F2 to the curable composition F4 and the curable composition G1 to the curable composition G5, the same evaluation was carried out. The results are also set forth in Table 3.
<Evaluation of Adhesion to Polyimide and Tin-Plated Copper>
Onto each of a copper substrate having been subjected to tin plating and a polyimide film [Kapton (registered trademark) 300EN, available from DuPont-Toray Co., Ltd.], the curable composition F1 was coated by screen printing so that the thickness (thickness after drying) of the composition from the copper substrate surface or the polyimide surface would

TABLE 2

| | Ex. 1-1 | Ex. 1-2 | Ex. 1-3 | Ex. 1-4 | Comp. Ex. 1-1 | Comp. Ex. 1-2 | Comp. Ex. 1-3 | Comp. Ex. 1-4 | Comp. Ex. 1-5 |
|---|---|---|---|---|---|---|---|---|---|
| Polyurethane solution used | Polyurethane solution A1 | Polyurethane solution A2 | Polyurethane solution A3 | Polyurethane solution A4 | Polyurethane solution B1 | Polyurethane solution B2 | Polyurethane solution B3 | Polyurethane solution B4 | Polyurethane solution B5 |
| Stability after storage at 5° C. for 1 week (Evaluation results of storage stability) | A | A | A | A | A | A | C | A | A |

From the results shown in Table 2, it can be seen that the polyurethane solutions of the present invention (I) can provide stable polyurethane solutions at a low temperature, and it can be seen that the polyurethane solution B3 had bad storage stability.

Examples 2-1 to 2-4, Comparative Examples 2-1 to 2-5

Using the curable compositions F1 to F4 and the curable compositions G1 to G5, evaluation of printability, evaluation of adhesion to polyimide and tin-plated copper, evaluation of be 15 μm, and then they were placed in a hot air circulation type dryer at 80° C. for 30 minutes. Thereafter, the copper substrate and the polyimide film were further placed in a hot air circulation type dryer at 120° C. for 60 minutes and then furthermore placed in a hot air dryer at 150° C. for 120 minutes to cure the coated curable composition F1.
The resulting cured coating film was cut to form 100 lattice patterns at intervals of 1 mm, and a cut tape having a length of about 75 mm and a width of 18 mm was allowed to adhere to the lattice portion and then stripped off (peeled off) at an angle close to 60° over a period of 0.5 to 1.0 second.
As the tape for peeling, a tape available from Nitto Denko Corporation was used, and the adhesion properties were evaluated according to the following criteria.

A: The number of squares remaining is not less than 80.

B: The number of squares remaining is not less than 50 but less than 80.

C: The number of squares remaining is less than 50.

The results are set forth in Table 3.

Using the curable composition F2 to the curable composition F4 and the curable composition G1 to the curable composition G5, the same evaluation was carried out. The results are also set forth in Table 3.

<Evaluation of Warpage Properties>

The curable composition F1 was coated onto a substrate by screen printing using a #100 mesh polyester screen, and the substrate was placed in a hot air circulation type dryer at 80° C. for 30 minutes. Thereafter, the substrate was further placed in a hot air circulation type dryer at 120° C. for 60 minutes to cure the coated curable composition F1. As the substrate, a polyimide film [Kapton (registered trademark) 100EN, available from DuPont-Toray Co., Ltd.] having a thickness of 25 μm was used.

The coating film obtained by coating the curable composition and curing it by the hot air circulation type dryer was cut into 50 mmΦ by a circle cutter. The circularly cut products undergo warpage in a convex or concave shape at the vicinity of the center thereof. After one hour, the product obtained by cutting with a circle cutter and consisting of the substrate and the cured film formed thereon was allowed to stand still in the downward convex state, that is, it was allowed to stand still in such a manner that the vicinity of the center of the laminate consisting of the substrate and the cured film formed thereon was brought into contact with a horizontal plane. Then, the maximum height of warpage from the horizontal plane and the minimum height thereof were measured, and the mean value was determined. The symbol represents a direction of warpage. When the product is allowed to stand still in the downward convex state, a case where the cured film is positioned on the upper side of the copper substrate or the polyimide film is represented by "+", and a case where the cured film is positioned on the lower side is represented by "−".

The results are set forth in Table 3.

Using the curable composition F2 to the curable composition F4 and the curable composition G1 to the curable composition G5, the same evaluation was carried out. The results are also set forth in Table 3.

<Evaluation of Long-Term Electrical Insulation Reliability>

Onto a flexible wiring board obtained by tin plating of a substrate having a shape of a fine comb-like pattern (copper line width/copper line space=15 μm/15 μm) described in JPCA-ET01, said substrate having been produced by etching a flexible copper-clad laminate (manufactured by Sumitomo Metal Mining Co., Ltd., grade name: Esperflex US, thickness of copper: 8 μm, thickness of polyimide: 38 μm), the curable composition F1 was coated by screen printing so that the thickness (after drying) of the composition from the polyimide surface would be 15 μm. The flexible wiring board was placed in a hot air circulation type dryer at 80° C. for 30 minutes, and thereafter, it was further placed in a hot air circulation type dryer at 120° C. for 120 minutes to cure the coated curable composition F1.

To the resulting specimen, a bias voltage of 60 V was applied, and a steady-state temperature humidity test was carried out under the conditions of a temperature of 120° C. and a humidity of 85% RH by the use of MIGRATION TESTER MODEL MIG-8600 (manufactured by IMV Corporation). The resistance values of the substrate having a shape of a fine comb-like pattern measured at the starting time point of the steady-state temperature humidity test, and after 30 hours, 50 hours and 100 hours from the start of the test are set forth in table 3.

Using the curable composition F2 to the curable composition F4 and the curable composition G1 to the curable composition G5, the same evaluation was carried out.

The results are also set forth in Table 3.

TABLE 3

| | | Unit | Ex. 1 | Ex. 2 | Ex. 3 | Ex. 4 |
|---|---|---|---|---|---|---|
| Curable composition used | | | curable composition F1 | curable composition F2 | curable composition F3 | curable composition F4 |
| Evaluation of printability | | | A | A | A | A |
| Evaluation of warpage properties | | mm | −2.0 | −2.0 | −2.0 | −2.0 |
| Evaluation of adhesion properties | Adhesion to polyimide | | A | A | A | A |
| | Adhesion to tin-plated copper | | A | A | A | A |
| Evaluation of long-term electrical insulation reliability | At the starting time point of test | Ω | $3 \times 10^8$ | $3 \times 10^8$ | $3 \times 10^8$ | $3 \times 10^8$ |
| | After 30 hours from the start | | $6 \times 10^8$ | $6 \times 10^8$ | $6 \times 10^8$ | $6 \times 10^8$ |
| | After 50 hours from the start | | $6 \times 10^8$ | $6 \times 10^8$ | $6 \times 10^8$ | $6 \times 10^8$ |
| | After 100 hours from the start | | $5 \times 10^8$ | $5 \times 10^8$ | $5 \times 10^8$ | $5 \times 10^8$ |

TABLE 3-continued

| | Unit | Comp. Ex. 1 | Comp. Ex. 2 | Comp. Ex. 3 | Comp. Ex. 4 | Comp. Ex. 5 |
|---|---|---|---|---|---|---|
| Curable composition used | | curable composition G1 | curable composition G2 | curable composition G3 | curable composition G4 | curable composition G5 |
| Evaluation of printability | | C | C | A | C | C |
| Evaluation of warpage properties | mm | −2.0 | −2.0 | −2.0 | −2.0 | −2.3 |
| Evaluation of adhesion properties — Adhesion to polyimide | | A | A | A | A | A |
| Evaluation of adhesion properties — Adhesion to tin-plated copper | | A | A | A | A | A |
| Evaluation of long-term electrical insulation reliability — At the starting time point of test | Ω | $3 \times 10^8$ | $3 \times 10^8$ | $3 \times 10^8$ | $3 \times 10^8$ | $3 \times 10^8$ |
| Evaluation of long-term electrical insulation reliability — After 30 hours from the start | | $6 \times 10^8$ | $6 \times 10^8$ | $6 \times 10^8$ | $6 \times 10^8$ | $8 \times 10^7$ |
| Evaluation of long-term electrical insulation reliability — After 50 hours from the start | | $6 \times 10^8$ | $6 \times 10^8$ | $6 \times 10^8$ | $6 \times 10^8$ | short circuit |
| Evaluation of long-term electrical insulation reliability — After 100 hours from the start | | $5 \times 10^8$ | $5 \times 10^8$ | $5 \times 10^8$ | $5 \times 10^8$ | short circuit |

From the results shown in Table 3, it can be seen that the curable compositions of the present invention (II) were excellent in low warpage properties and long-term electrical insulation reliability and bleeding during the screen printing was effectively suppressed concerning the curable compositions.

The cured products were useful as insulation protective films for flexible wiring boards.

The invention claimed is:

1. A curable composition comprising the following components (a) to (e):
    a component (a): polyurethane having a functional group capable of curing reaction and a carbonate bond,
    a component (b): γ-butyrolactone,
    a component (c): diethylene glycol diethyl ether,
    a component (d): inorganic fine particles and/or organic fine particles, and
    a component (e): a compound having two or more epoxy groups in one molecule,
    the ratio in terms of mass between the component (b) and the component (c) being in the range of 90:10 to 20:80 (component (b):component (c)).

2. The curable composition as claimed in claim 1, wherein the component (a) is polyurethane having at least one functional group selected from the group consisting of a carboxyl group, an isocyanate group and a cyclic acid anhydride group, and a carbonate bond.

3. The curable composition as claimed in claim 1, wherein the component (d) consists of silica fine particles.

4. The curable composition as claimed in claim 1, which further comprises a curing accelerator.

5. The curable composition as claimed in claim 1, which further comprises a defoaming agent.

6. The curable composition as claimed in claim 1, wherein the component (e) is a compound having two or more epoxy groups in one molecule and having an aromatic ring structure and/or an alicyclic structure.

7. The curable composition as claimed in claim 6, wherein the component (e) is a compound having two or more epoxy groups in one molecule and having a tricyclodecane structure and an aromatic ring structure.

8. The curable composition as claimed in claim 1, which has a thixotropy index of not less than 1.1.

9. A cured product obtained by curing the curable composition as claimed in claim 1.

10. A flexible wiring board covered with a cured product, wherein a surface of a flexible wiring board in which wiring is formed on a flexible substrate is partially or wholly covered with the cured product as claimed in claim 9.

11. A process for producing a flexible wiring board covered with a protective film, comprising:
    printing the curable composition as claimed in claim 1 on at least a part of a tin-plated wiring pattern portion of a flexible wiring board to form a printed film on the pattern, and
    thermally curing the printed film at 80 to 130° C. to form a protective film.

* * * * *